(12) United States Patent
Shimizu

(10) Patent No.: US 11,101,355 B2
(45) Date of Patent: Aug. 24, 2021

(54) SEMICONDUCTOR DEVICE, POWER CIRCUIT, AND COMPUTER

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 92 days.

(21) Appl. No.: 16/407,681

(22) Filed: May 9, 2019

(65) Prior Publication Data

US 2019/0267457 A1 Aug. 29, 2019

Related U.S. Application Data

(63) Continuation of application No. 15/446,585, filed on Mar. 1, 2017, now Pat. No. 10,388,742.

(30) Foreign Application Priority Data

Jul. 22, 2016 (JP) ................. 2016-144518

(51) Int. Cl.
| | | |
|---|---|---|
| *H01L 29/40* | (2006.01) | |
| *H01L 29/207* | (2006.01) | |
| *H01L 29/778* | (2006.01) | |
| *H01L 29/20* | (2006.01) | |
| *H01L 29/205* | (2006.01) | |
| *H01L 29/66* | (2006.01) | |
| *H01L 29/10* | (2006.01) | |

(52) U.S. Cl.
CPC ........ *H01L 29/408* (2013.01); *H01L 29/2003* (2013.01); *H01L 29/205* (2013.01); *H01L 29/207* (2013.01); *H01L 29/66462* (2013.01); *H01L 29/7786* (2013.01); *H01L 29/7787* (2013.01); *H01L 29/1066* (2013.01); *H01L 2924/13064* (2013.01)

(58) Field of Classification Search
CPC ............ H01L 29/408; H01L 29/66462; H01L 29/7786–29/7787; H01L 2924/13064
See application file for complete search history.

(56) References Cited

U.S. PATENT DOCUMENTS

| | | | |
|---|---|---|---|
| 10,079,285 B2 | 9/2018 | Shimizu et al. | |
| 2010/0025730 A1* | 2/2010 | Heikman | H01L 29/7787 257/194 |
| 2012/0211901 A1* | 8/2012 | Shimizu | H01L 24/29 257/783 |

(Continued)

FOREIGN PATENT DOCUMENTS

| | | |
|---|---|---|
| JP | 10-101496 A | 4/1998 |
| JP | 10-144980 A | 5/1998 |

(Continued)

*Primary Examiner* — Amar Movva
(74) *Attorney, Agent, or Firm* — Oblon, McClelland, Maier & Neustadt, L.L.P.

(57) ABSTRACT

A semiconductor device according to an embodiment includes a nitride semiconductor layer, an insulating layer provided on the nitride semiconductor layer, a first region provided in the nitride semiconductor layer, and a second region which is provided between the first region in the nitride semiconductor layer and the insulating layer, has a higher electric resistivity than the first region, and includes carbon (C).

11 Claims, 20 Drawing Sheets

(56) References Cited

U.S. PATENT DOCUMENTS

| | | | |
|---|---|---|---|
| 2013/0256683 A1 | 10/2013 | Imanishi | |
| 2014/0008661 A1 | 1/2014 | Iwami et al. | |
| 2014/0367694 A1* | 12/2014 | Kamada | H01L 23/3171 |
| | | | 257/76 |
| 2016/0118489 A1 | 4/2016 | Hikita et al. | |

FOREIGN PATENT DOCUMENTS

| | | |
|---|---|---|
| JP | 2000-294880 A | 10/2000 |
| JP | 2005-340789 A | 12/2005 |
| JP | 2007-305630 A | 11/2007 |
| JP | 2009-117482 A | 5/2009 |
| JP | 2010-171416 | 8/2010 |
| JP | 2011-210750 A | 10/2011 |
| JP | 2011-529639 A | 12/2011 |
| JP | 2013-8836 | 1/2013 |
| JP | 2013-69714 A | 4/2013 |
| JP | 2013-207107 A | 10/2013 |
| JP | 2014-17285 | 1/2014 |
| JP | 2015-19052 | 1/2015 |
| JP | 2016-100471 A | 5/2016 |
| JP | 2016-144516 | 8/2016 |
| JP | 2018-14456 A | 1/2018 |
| WO | WO 2015/008430 A1 | 1/2015 |

* cited by examiner

SEMICONDUCTOR DEVICE, POWER CIRCUIT, AND COMPUTER

CROSS-REFERENCE TO RELATED APPLICATIONS

This application is a continuation of U.S. application Ser. No. 15/446,585, filed on Mar. 1, 2017, and claims the benefit of priority from Japanese Patent Application No. 2016-144518, filed on Jul. 22, 2016, the entire contents of which are incorporated herein by reference.

FIELD

Embodiments described herein relate generally to a semiconductor device, a power circuit, and a computer.

BACKGROUND

A semiconductor element, such as a switching element or a diode, is used in a circuit such as a switching power supply or an inverter. The semiconductor element requires a high breakdown voltage and low on-resistance. The relationship between the breakdown voltage and the on-resistance is a trade-off relationship which is determined by semiconductor material.

With the progress of technical development, the on-resistance of a semiconductor element is reduced to the limit of silicon which is major semiconductor material in use. It is necessary to change the semiconductor material in order to further improve the breakdown voltage or to further reduce the on-resistance.

A GaN-based semiconductor, such as gallium nitride (GaN) or aluminum gallium nitride (AlGaN), has a higher bandgap than silicon. When the GaN-based semiconductor is used as a switching semiconductor material, it is possible to improve the trade-off relationship determined by the semiconductor material and to significantly increase the breakdown voltage or to significantly reduce the on-resistance.

However, for example, a switching element using the GaN-based semiconductor has the problem of "current collapse" in which, when a high drain voltage is applied, on-resistance increases.

DETAILED DESCRIPTION

Figure 1:
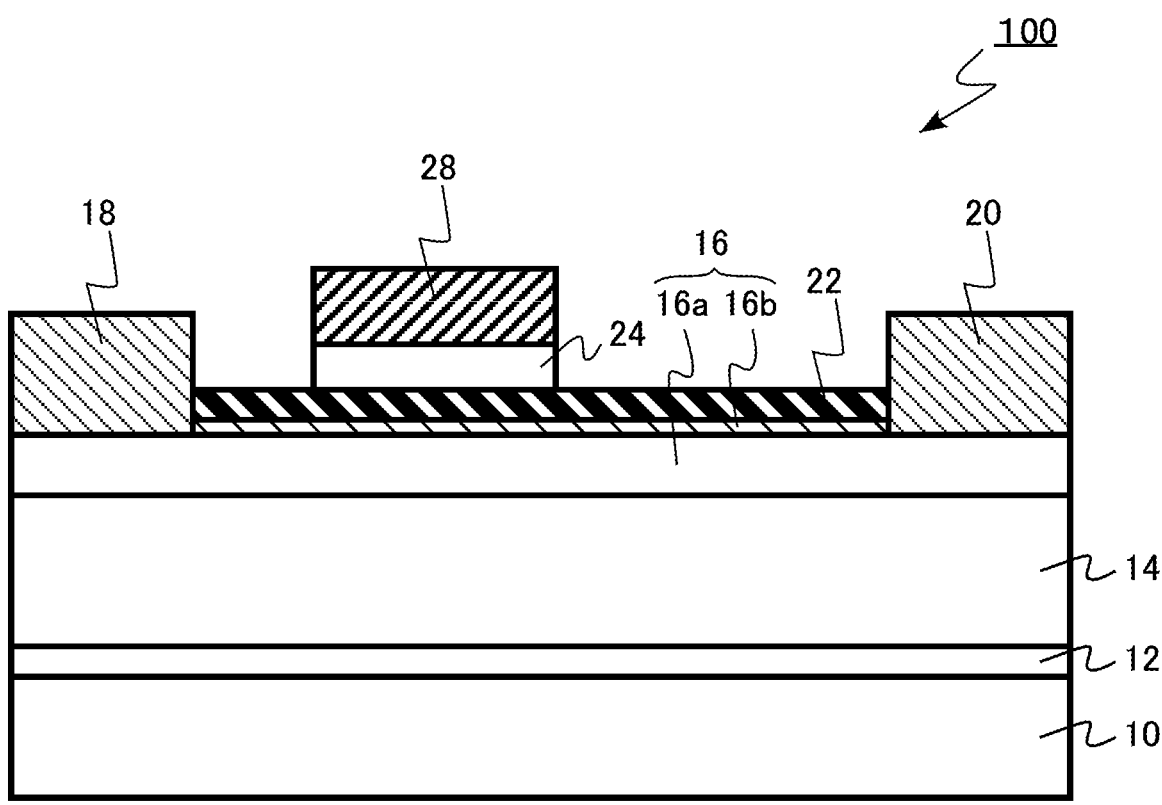
FIG. 1 is a cross-sectional view schematically illustrating a semiconductor device according to a first embodiment.

A semiconductor device according to an aspect of the invention includes a nitride semiconductor layer, an insulating layer provided on the nitride semiconductor layer, a first region provided in the nitride semiconductor layer, and a second region which is provided between the first region in the nitride semiconductor layer and the insulating layer, has a higher electric resistivity than the first region, and includes carbon (C).

In the specification, the same or similar members are denoted by the same reference numerals and the description thereof will not be repeated.

In the specification, a "GaN-based semiconductor" is a general term of a semiconductor including gallium nitride (GaN), aluminum nitride (AlN), indium nitride (InN), and an intermediate composition thereof.

In the specification, the upward direction in the drawings is represented by an "upper side" and the downward direction in the drawings is represented by a "lower side", in order to indicate the positional relationship between components. In the specification, the concept of the "upper side" and the "lower side" does not necessarily indicate the positional relationship with the direction of gravity.

First Embodiment

A semiconductor device according to this embodiment includes a nitride semiconductor layer, an insulating layer provided on the nitride semiconductor layer, a first region provided in the nitride semiconductor layer, and a second region which is provided between the first region in the nitride semiconductor layer and the insulating layer, has a higher electric resistivity than the first region, and includes carbon (C).

In addition, a semiconductor device according to this embodiment includes a nitride semiconductor layer, an insulating layer provided on the nitride semiconductor layer, and a region which is provided in an insulating-layer-side portion of the nitride semiconductor layer and includes an atom X that is an atom other than a nitrogen atom forming a crystal structure of the nitride semiconductor layer, forms a bond with a carbon atom, and has a dangling bond.

In the above-mentioned structure of the semiconductor device according to this embodiment, it is possible to reduce a level (state) that is present in the vicinity of the interface between the nitride semiconductor layer and the insulating layer and becomes an electron trap. Therefore, it is possible to prevent current collapse caused by the electron trap.

Hereinafter, an example in which, when atoms other than nitrogen atoms forming the crystal structure of the nitride semiconductor layer are atoms X, the atoms X are gallium (Ga) atoms or the atoms X are gallium (Ga) atoms and aluminum (Al) atoms will be described. That is, an example in which the nitride semiconductor layer is made of gallium nitride or aluminum gallium nitride will be described.

FIG. 1 is a cross-sectional view schematically illustrating the semiconductor device according to this embodiment. The semiconductor device according to this embodiment is a high electron mobility transistor (HEMT) using a GaN-based semiconductor.

As illustrated in FIG. 1, an HEMT (semiconductor device) 100 includes a substrate 10, a buffer layer 12, a channel layer (first semiconductor region) 14, a barrier layer (second semiconductor region) 16, a source electrode (first electrode) 18, a drain electrode (second electrode) 20, an insulating layer 22, a p-type layer 24, and a gate electrode 28.

The channel layer (first semiconductor region) 14 and the barrier layer (second semiconductor region) 16 are nitride semiconductor layers. The barrier layer 16 includes a low-resistance region (first region) 16a and a high-resistance region (a second region or a region) 16b.

The substrate 10 is made of, for example, silicon (Si). In addition to silicon, for example, sapphire ($Al_2O_3$) or silicon carbide (SiC) may be applied to the substrate 10.

The buffer layer 12 is provided on the substrate 10. The buffer layer 12 has a function of reducing the lattice mismatch between the substrate 10 and the channel layer 14. The buffer layer 12 has a multi-layer structure of, for example, aluminum gallium nitride ($Al_WGa_{1-W}N$ (0<W<1)).

The channel layer 14 is provided on the buffer layer 12. The channel layer 14 is also referred to as an electron transit layer. The channel layer 14 is made of, for example, $Al_XGa_{1-X}N$ (0≤X<1). Specifically, the channel layer 14 is made of,
for example, GaN. The thickness of the channel layer 14 is, for example, equal to or greater than 0.1 µm and equal to or less than 10 µm.

The barrier layer 16 is provided on the channel layer 14. The barrier layer 16 is also referred to as an electron supply layer. The bandgap of the barrier layer 16 is greater than the bandgap of the channel layer 14. The barrier layer 16 is made of, for example, $Al_YGa_{1-Y}N$ (0<Y≤1, X<Y). Specifically, the barrier layer 16 is made of, for example, $Al_{0.25}Ga_{0.75}N$. The thickness of the barrier layer 16 is, for example, equal to or greater than 10 nm and equal to or less than 100 nm.

The interface between the channel layer 14 and the barrier layer 16 is a hetero-junction interface. A two-dimensional electron gas (2 DEG) is formed at the hetero-junction interface of the HEMT 100 and becomes a carrier.

The barrier layer 16 includes the low-resistance region 16a and the high-resistance region 16b. The high-resistance region 16b is provided in the barrier layer 16 so as to be close to or adjacent to the insulating layer 22. For example, the high-resistance region 16b comes into contact with the insulating layer 22.

The electric resistivity of the high-resistance region 16b is higher than the electric resistivity of the low-resistance region 16a. The magnitude relationship between the electric resistivities can be determined by, for example, spreading resistance analysis (SRA) or scanning spreading resistance microscopy (SSRM).

The electric resistivity of the low-resistance region 16a is reduced since carrier concentration is higher than that of the high-resistance region 16b. Therefore, the magnitude relationship between the electric resistivities can be determined by, for example, scanning capacitance microscopy (SCM) that can determine the magnitude of carrier concentration.

For example, there is a nitrogen defect (hereinafter, also referred to as VN) in aluminum gallium nitride in the low-resistance region 16a. The nitrogen defect functions as a donor. Therefore, the nitrogen defect causes aluminum gallium nitride to change to an n type. As a result, the electric resistivity of the low-resistance region 16a is reduced.

The high-resistance region 16b includes one carbon atom that is present at the lattice position of a nitrogen atom. For example, one carbon atom is introduced to the lattice position of a nitrogen atom in aluminum gallium nitride. The one carbon atom introduced to the lattice position of the nitrogen atom function as an acceptor.

The carrier concentration of the high-resistance region 16b is lower than that of the low-resistance region 16a due to the interaction between VN functioning as a donor and the carbon atom functioning as an acceptor. Therefore, the electric resistivity of the high-resistance region 16b is higher than that of the low-resistance region 16a.

In the high-resistance region 16b, VN and the carbon atom are adjacent to each other. In the high-resistance region 16b, VN and the carbon atom are so close that they electrically interact with each other.

In the high-resistance region 16b, it is preferable that the amount of carbon atoms be substantially equal to the amount of VN. Here, that the amount of carbon atoms is substantially equal to the amount of VN means, for example, that the amount of VN is equal to or greater than 0.8 times the amount of carbon atoms and equal to or less than 1.2 times the amount of carbon atoms.

It is assumed that an atom other than a nitrogen atom forming the barrier layer 16 is an atom X. In this case, in the HEMT 100, the high-resistance region 16b includes the atom X that forms a bond with a carbon atom and has a dangling bond. Since the atom X forms a bond with the carbon atom and has a dangling bond, a structure in which the carbon atom and VN are closest to each other is achieved. In other words, the carbon atom, the atom X, and VN form a complex.

The bond between the atom X and the carbon atom, the dangling bond of the atom X, and a complex of the carbon atom, the atom X, and VN in the high-resistance region 16b can be measured by, for example, X-ray photoelectron spectroscopy (XPS), infrared spectroscopy, or Raman spectroscopy.

When the carbon atom and VN form a complex, the carbon atom and VN have the same spatial distribution.

The carbon concentration of the high-resistance region 16b is, for example, equal to or greater than $1 \times 10^{19}$ cm$^{-3}$. The carbon concentration of the high-resistance region 16b can be measured by, for example, secondary ion mass spectroscopy (SIMS).

For example, when the atom X is a gallium (Ga) atom, one gallium atom is bonded to one carbon atom and one gallium atom has a dangling bond. When the atom X is an aluminum (Al) atom, one aluminum atom is bonded to one carbon atom and one aluminum atom has a dangling bond.

The thickness of the high-resistance region 16b is, for example, equal to or greater than 0.5 nm and equal to or less than 10 nm. The electric resistivity of the high-resistance region 16b is not necessary be uniform. The electric resistivity may have variation in the high-resistance region 16b.

The insulating layer 22 is provided on the high-resistance region 16b. The insulating layer 22 functions as a gate insulating layer of the HEMT 100.

The insulating layer 22 is made of, for example, silicon oxide. The insulating layer 22 may be made of, for example, silicon nitride or silicon oxynitride. In addition, the insulating layer 22 may be, for example, a stacked structure of materials selected from silicon oxide, silicon nitride, and silicon oxynitride.

The thickness of the insulating layer 22 is, for example, equal to or greater than 10 nm and equal to or less than 100 nm.

The source electrode 18 and the drain electrode 20 are formed on the barrier layer 16. The source electrode 18 and the drain electrode 20 come into contact with the low-resistance region 16a.

The source electrode 18 and the drain electrode 20 are, for example, metal electrodes. The metal electrode is, for example, a stacked structure of titanium (Ti) and aluminum (Al).

It is preferable that the source electrode 18 and the drain electrode 20 come into ohmic contact with the barrier layer 16. Since the source electrode 18 and the drain electrode 20 come into contact with the low-resistance region 16a, it is possible to achieve an ohmic contact.

The distance between the source electrode 18 and the drain electrode 20 is, for example, equal to or greater than 5 μm and equal to or less than 30 μm.

The p-type layer 24 is provided on the insulating layer 22 between the source electrode 18 and the drain electrode 20. The p-type layer 24 has a function of increasing the threshold voltage of the HEMT 100. Since the p-type layer 24 is provided, the HEMT 100 can operate as a normally-off transistor.

The p-type layer 24 is made of, for example, p-type gallium nitride (GaN) to which magnesium (Mg) is applied as p-type impurities. The p-type layer 24 is, for example, polycrystalline.

The gate electrode 28 is provided on the p-type layer 24. The gate electrode 28 is, for example, a metal electrode. The gate electrode 28 is made of, for example, titanium nitride (TiN).

Next, an example of a method for manufacturing the semiconductor device according to this embodiment will be described. FIGS. 2 to 8 are cross-sectional views schematically illustrating the semiconductor device according to this embodiment which is being manufactured.

First, the substrate 10, for example, a Si substrate is prepared. Then, for example, the buffer layer 12 is grown on the Si substrate by epitaxial growth.

The buffer layer 12 is, for example, a multi-layer structure of aluminum gallium nitride ($Al_wGa_{1-w}N$ (0<W<1)). For example, the buffer layer 12 is grown by a metal organic chemical vapor deposition (MOCVD) method.

Figure 2:
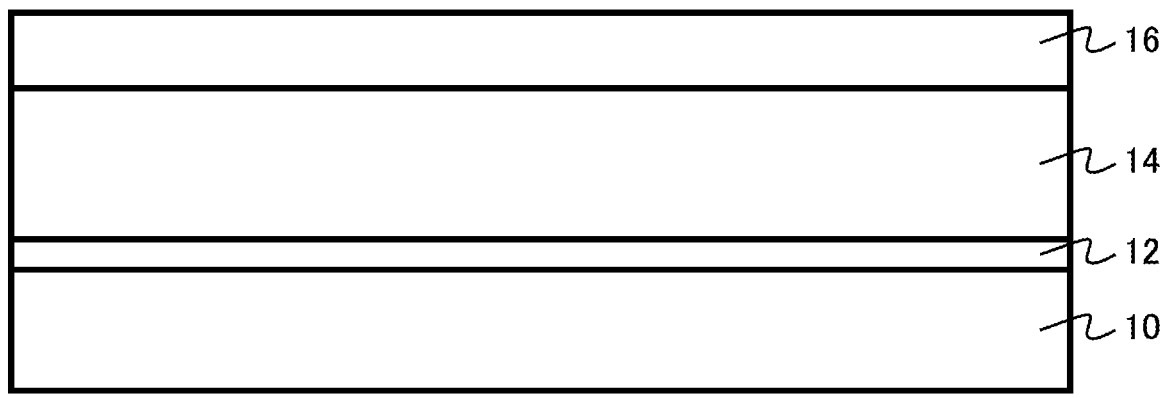
FIG. 2 is a cross-sectional view schematically illustrating the semiconductor device according to the first embodiment which is being manufactured.

Then, gallium nitride which will be the channel layer 14 and aluminum gallium nitride which will be the barrier layer 16 are formed on the buffer layer 12 by epitaxial growth (FIG. 2). The aluminum gallium nitride has, for example, a composition of $Al_{0.25}Ga_{0.75}N$. For example, the channel layer 14 and the barrier layer 16 are grown by the MOCVD method.

Figure 3:
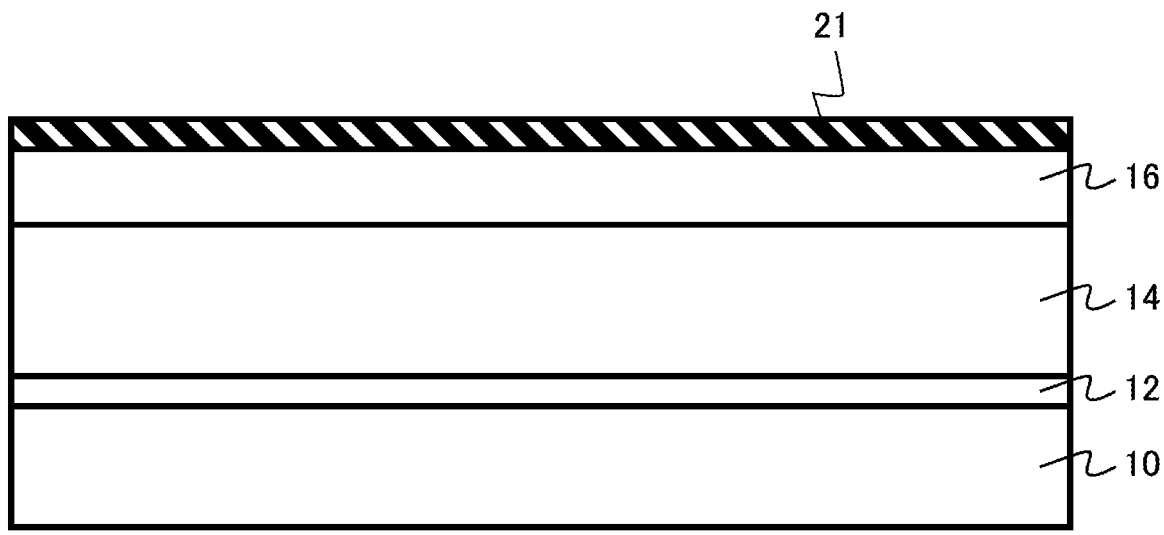
FIG. 3 is a cross-sectional view schematically illustrating the semiconductor device according to the first embodiment which is being manufactured.

Then, an insulating layer 21 is formed on the barrier layer 16 (FIG. 3). The insulating layer 21 is, for example, a silicon oxide layer, a silicon oxynitride layer, or a silicon nitride layer which is formed by a CVD method. The insulating layer 21 is a through film which is used in the subsequent carbon ion implantation process.

Figure 4:
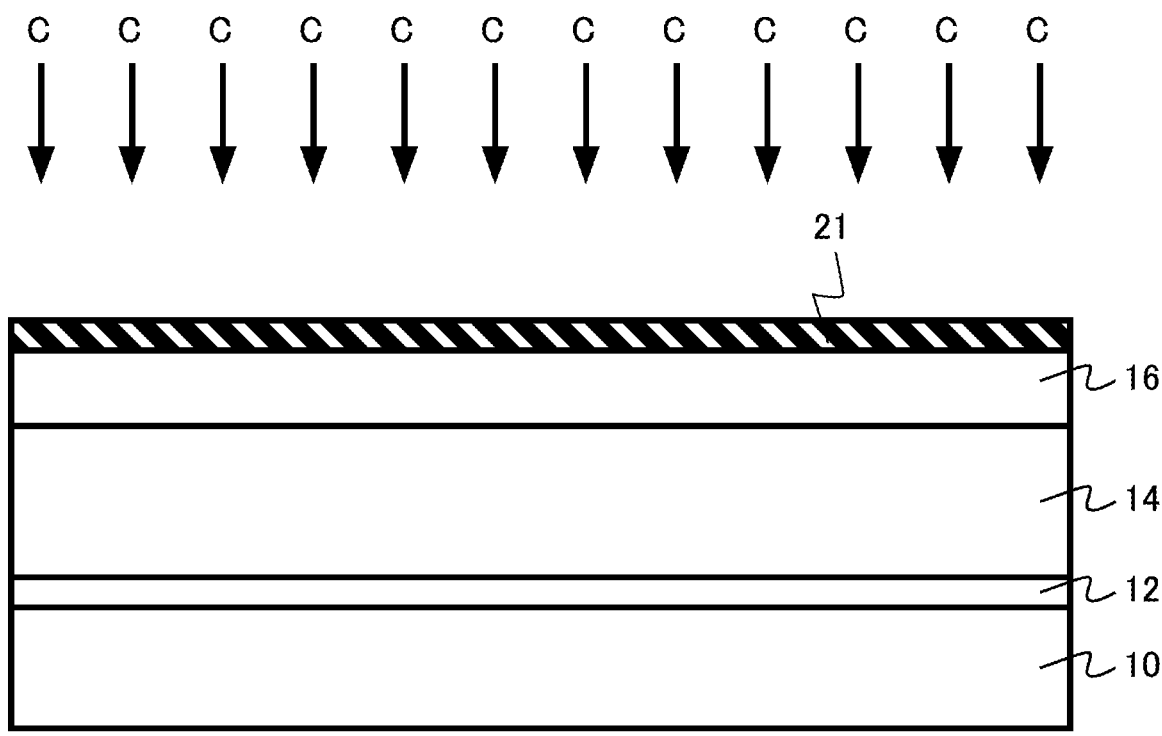
FIG. 4 is a cross-sectional view schematically illustrating the semiconductor device according to the first embodiment which is being manufactured.

Then, carbon ions are implanted into the barrier layer 16 through the insulating layer 21 (FIG. 4). For example, an accelerating voltage is set such that the projected range (RP) of the carbon ions is in the vicinity of the interface between the barrier layer 16 and the insulating layer 21. Carbon is also included in the insulating layer 21.

Then, a heat treatment is performed in a non-oxidizing atmosphere. The heat treatment temperature is, for example, equal to or greater than 900° C. and equal to or less than 1200° C. The heat treatment atmosphere is, for example, a nitrogen atmosphere or an argon atmosphere.

Figure 5:
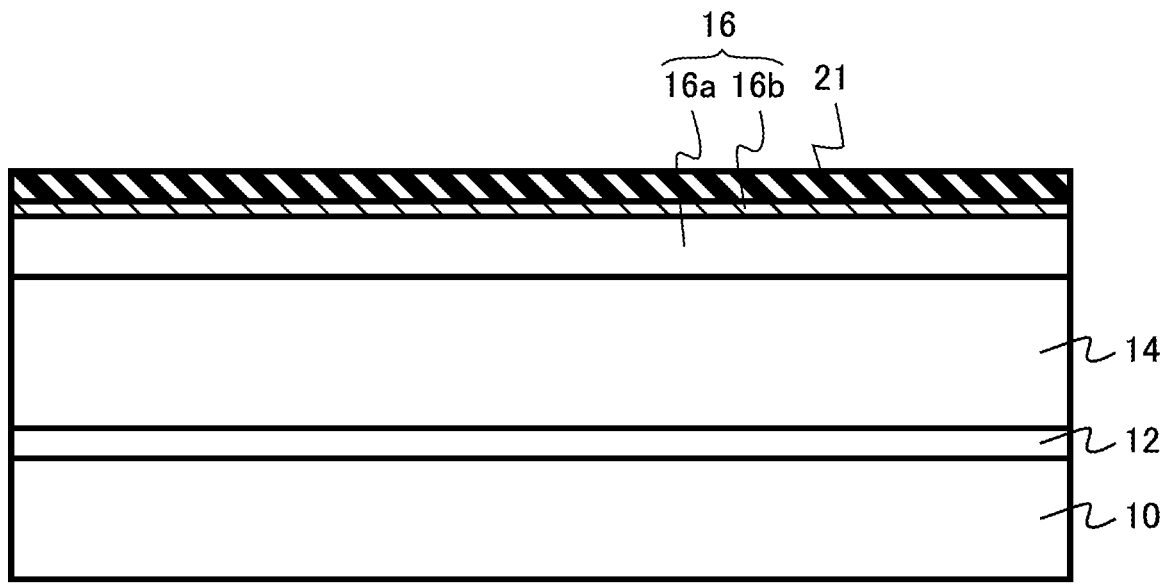
FIG. 5 is a cross-sectional view schematically illustrating the semiconductor device according to the first embodiment which is being manufactured.

The high-resistance region 16b is formed in a portion of the barrier layer 16 which is close to the insulating layer 21 by the heat treatment (FIG. 5). A portion of the barrier layer 16 below the high-resistance region 16b becomes the low-resistance region 16a having a lower electric resistivity than the high-resistance region 16b.

One carbon atom is introduced to the lattice position of a nitrogen atom in the barrier layer 16 to form the high-resistance region 16b. For example, one carbon atom is introduced to a nitrogen defect of the barrier layer 16.

For example, gallium or aluminum in the barrier layer 16 is diffused into the insulating layer 21. During the heat treatment, VN is generated in the barrier layer 16. Nitrogen which has been generated during the heat treatment is also diffused into the insulating layer 21.

Figure 6:
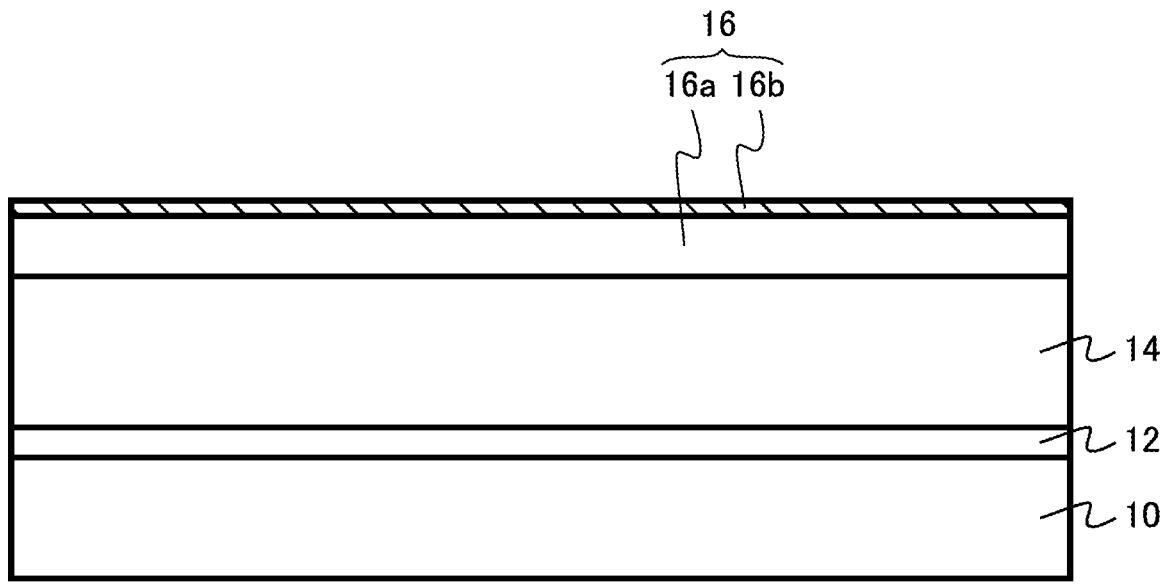
FIG. 6 is a cross-sectional view schematically illustrating the semiconductor device according to the first embodiment which is being manufactured.

Then, the insulating layer 21 is removed by wet etching (FIG. 6). The insulating layer 21 is removed under the condition that the high-resistance region 16b remains. Impurities, such as nitrogen, carbon, gallium, or aluminum, included in the insulating layer 21 are removed together with the insulating layer 21.

Figure 7:
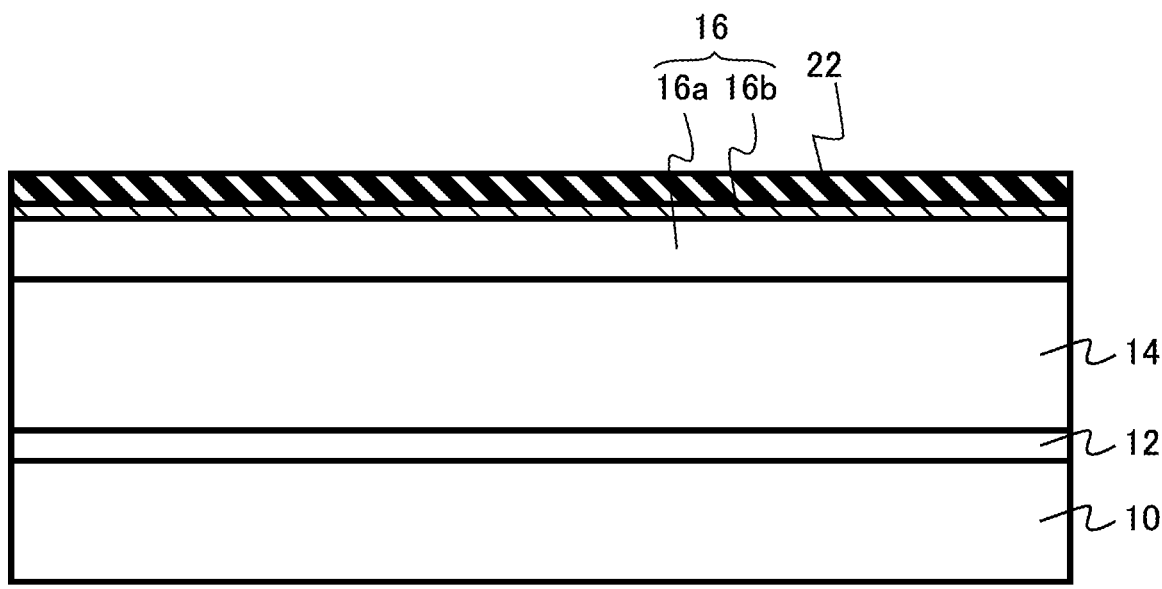
FIG. 7 is a cross-sectional view schematically illustrating the semiconductor device according to the first embodiment which is being manufactured.

Then, the insulating layer 22 is formed on the barrier layer 16 (FIG. 7). The insulating layer 22 is, for example, a silicon oxide layer which is formed by the CVD method.

Figure 8:
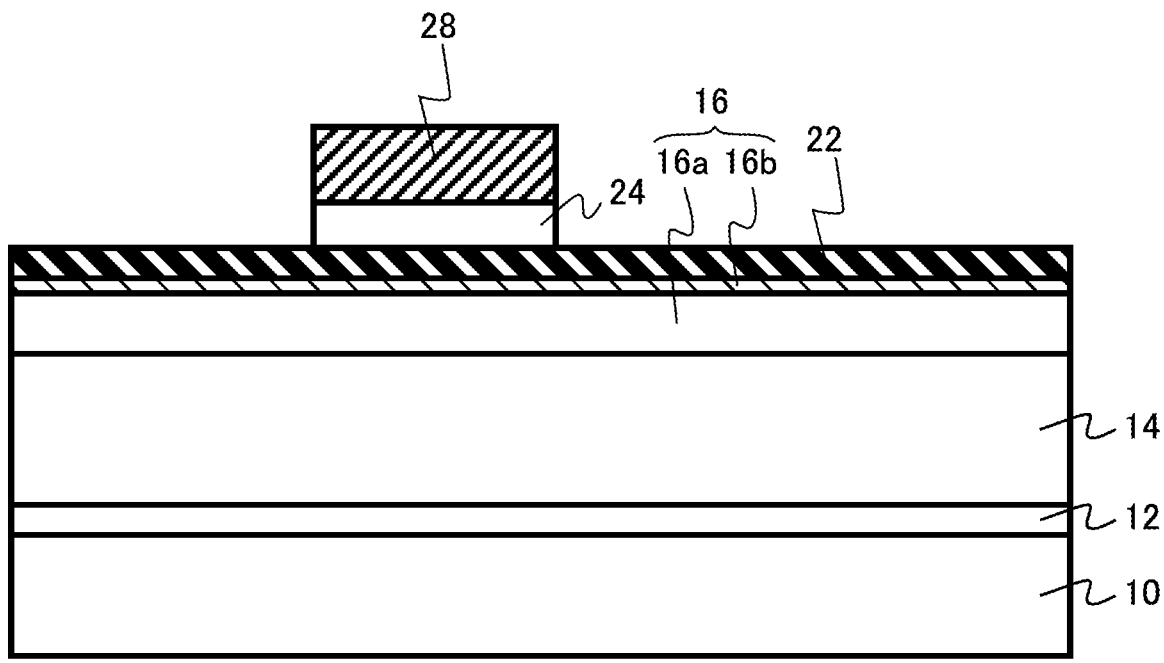
FIG. 8 is a cross-sectional view schematically illustrating the semiconductor device according to the first embodiment which is being manufactured.

Then, the p-type layer 24 and the gate electrode 28 are formed on the insulating layer 22 (FIG. 8).

Then, the source electrode 18 and the drain electrode 20 are formed on the barrier layer 16. When the source electrode 18 and the drain electrode 20 are formed, the high-resistance region 16b is removed by etching.

The source electrode 18 and the drain electrode 20 are formed so as to come into contact with the low-resistance region 16a. The source electrode 18 and the drain electrode 20 are formed, with the gate electrode 28 interposed therebetween.

The HEMT 100 illustrated in FIG. 1 is formed by the above-mentioned manufacturing method.

Next, the function and effect of the semiconductor device and the semiconductor device manufacturing method according to this embodiment will be described. FIGS. 9A, 9B, 10, 11A, 11B, 12, 13A, 13B, and 14 are diagrams illustrating the function of the semiconductor device and the semiconductor device manufacturing method according to this embodiment. Hereinafter, an example in which gallium nitride is used as the nitride semiconductor will be described.

Figure 9A:
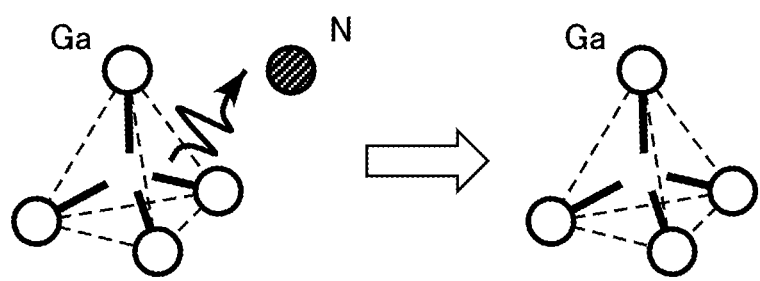
FIGS. 9A and 9B are diagrams illustrating the function and effect of the semiconductor device and a semiconductor device manufacturing method according to the first embodiment.
Figure 9B:
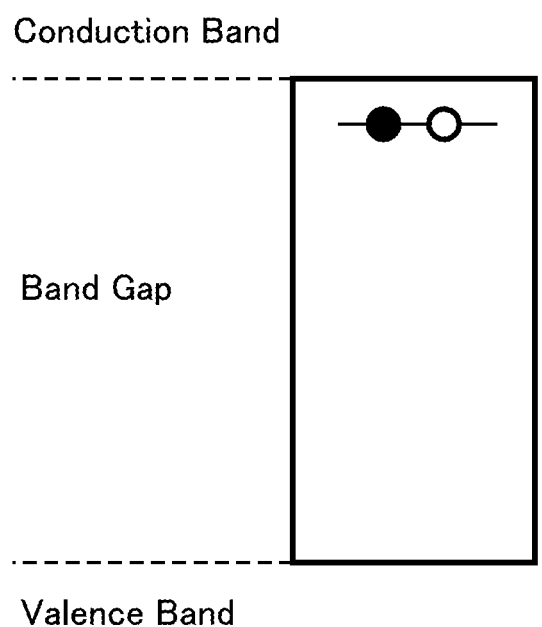
Figure 10:
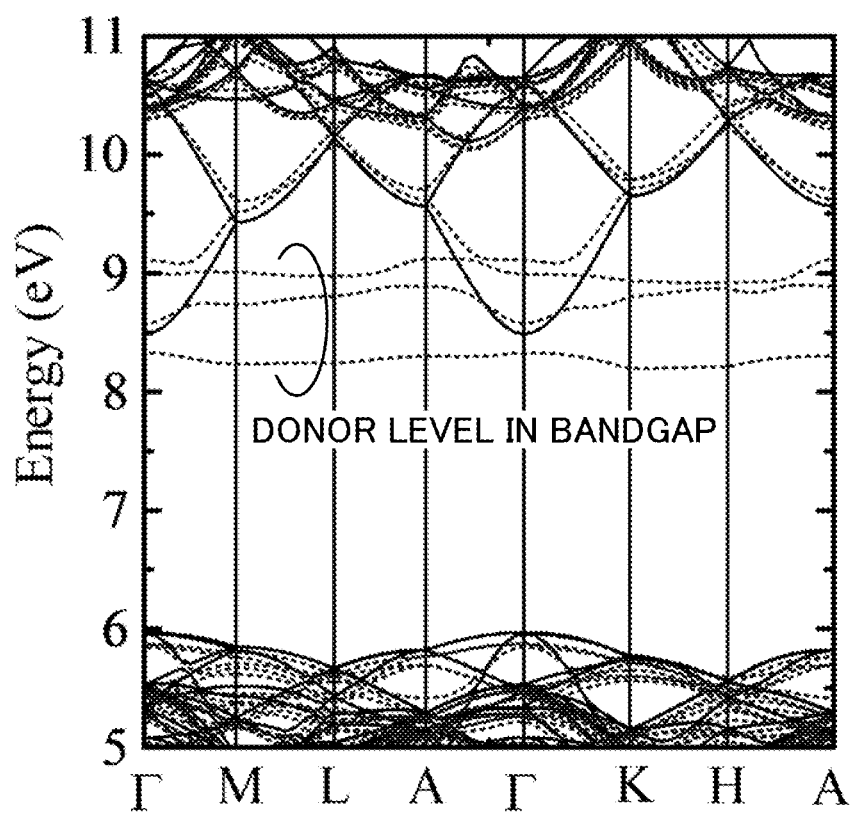
FIG. 10 is a diagram illustrating the function and effect of the semiconductor device and the semiconductor device manufacturing method according to the first embodiment.

FIGS. 9A and 9B and FIG. 10 are diagrams illustrating a nitrogen defect (VN). FIG. 9A is a diagram schematically illustrating VN in gallium nitride. FIG. 9B is a diagram illustrating the level formed by VN which is calculated by first principle calculation. FIG. 10 is a band diagram illustrating gallium nitride that includes VN calculated by the first principle calculation.

As illustrated in FIG. 9A, VN in gallium nitride is formed by the separation of a nitrogen atom from the gallium nitride. A gallium atom adjacent to VN has a dangling bond. VN functions as a donor in the gallium nitride.

The first principle calculation proves that a donor level is formed in the bandgap of gallium nitride by VN, as illustrated in FIGS. 9B and 10. In FIG. 9B, a black circle indicates a state in which the level is filled with an electron and a white circle indicates a state in which the level is not filled with an electron.

In the HEMT, it is considered that one of the causes of current collapse is a change in the density of 2 DEG caused by the trapping of an electron at the level of the bandgap. In general, VN is present in gallium nitride. It is considered that the density of VN is particularly high in the vicinity of the interface between the barrier layer 16 and the insulating layer 22. In addition, the dangling bond of a gallium atom is present at the interface between the barrier layer 16 and the insulating layer 22.

For example, when an electron is trapped at the level formed by VN, VN is negatively charged. Therefore, for example, the density of 2 DEG immediately below VN is reduced. As a result, current collapse occurs.

When an electron is trapped in VN immediately below the gate electrode 28, the threshold voltage of the HEMT 100 varies.

The dangling bond of the gallium atom that is present at the interface between the barrier layer 16 and the insulating layer 22 forms the same level as VN. Therefore, the function generated by the dangling bond of the gallium atom that is present at the interface between the barrier layer 16 and the insulating layer 22 is the same as that generated by VN.

Figure 11A:
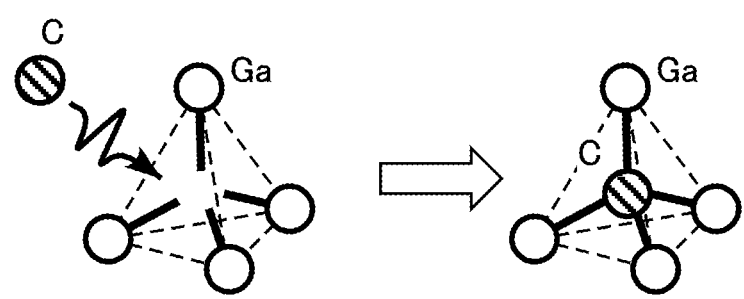
FIGS. 11A and 11B are diagrams illustrating the function and effect of the semiconductor device and the semiconductor device manufacturing method according to the first embodiment.
Figure 11B:
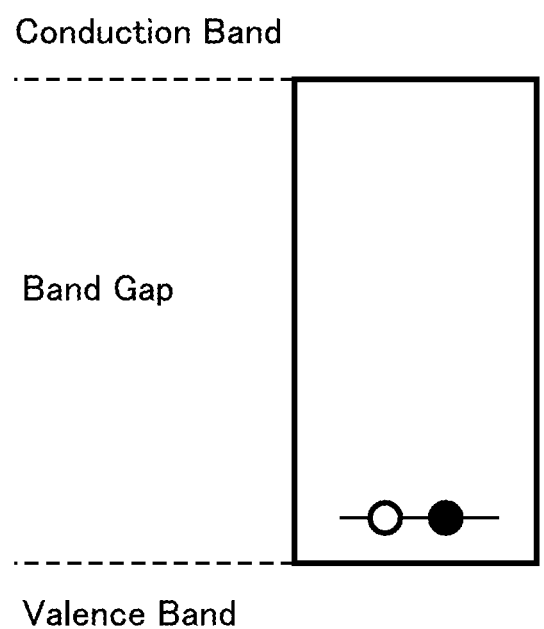
Figure 12:
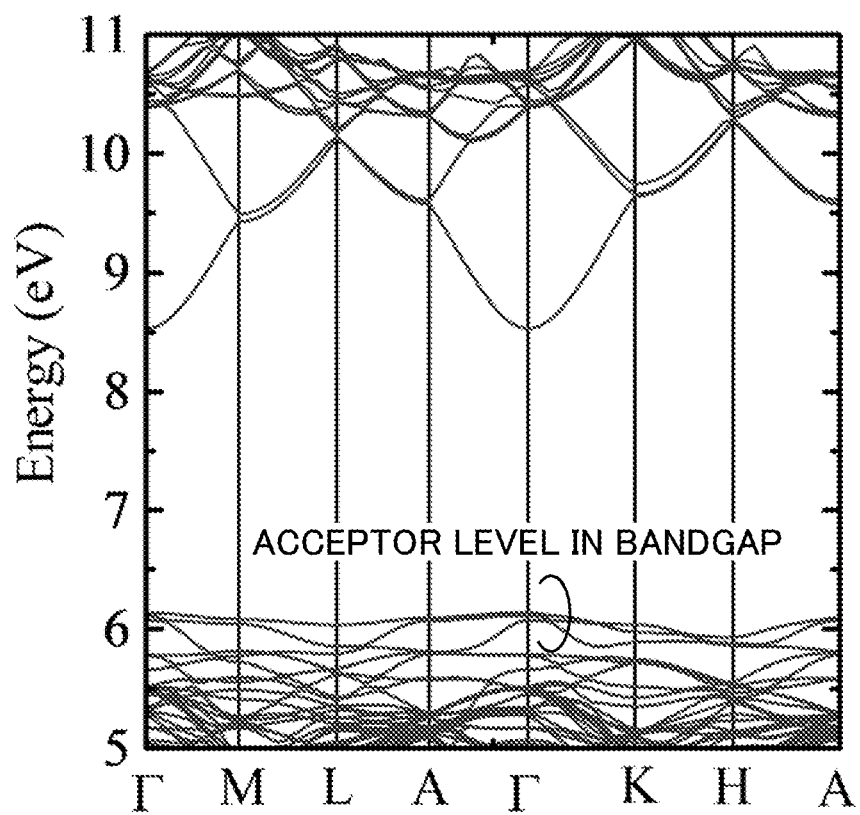
FIG. 12 is a diagram illustrating the function and effect of the semiconductor device and the semiconductor device manufacturing method according to the first embodiment.

FIGS. 11A and 11B and FIG. 12 are diagrams illustrating one carbon atom that is present at the lattice position of a nitrogen atom. FIG. 11A is a diagram schematically illustrating one carbon atom that is present at the lattice position of a nitrogen atom in gallium nitride. FIG. 11B is a diagram illustrating the level formed by the carbon atom which is calculated by the first principle calculation. FIG. 12 is a band diagram illustrating gallium nitride that includes the carbon atom calculated by the first principle calculation.

As illustrated in FIG. 11A, one carbon atom is introduced to VN in gallium nitride. Therefore, one carbon atom that is present at the lattice position of a nitrogen atom in gallium nitride is formed. The carbon atom functions as an acceptor in the gallium nitride.

The first principle calculation proves that the carbon atom introduced to the VN forms an acceptor level in the bandgap of gallium nitride as illustrated in FIGS. 11B and 12. In FIG. 11B, a black circle indicates a state in which the level is filled with an electron and a white circle indicates a state in which the level is not filled with an electron.

Figure 13A:
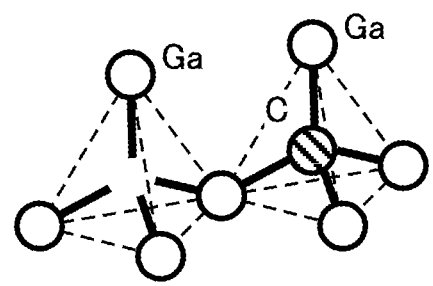
FIGS. 13A and 13B are diagrams illustrating the function and effect of the semiconductor device and the semiconductor device manufacturing method according to the first embodiment.
Figure 13B:
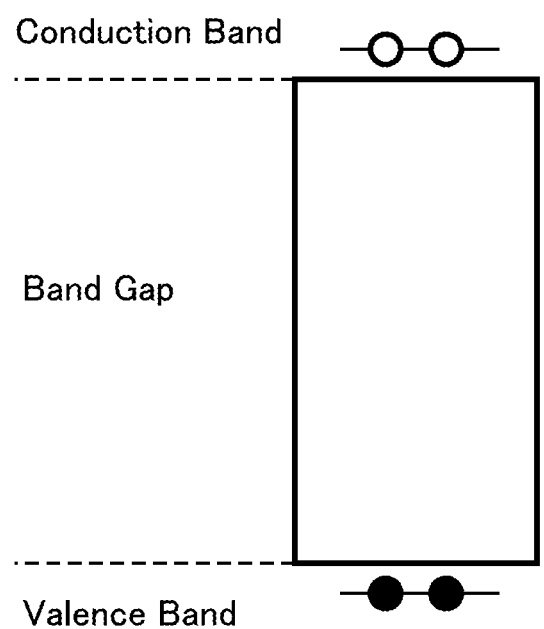
Figure 14:
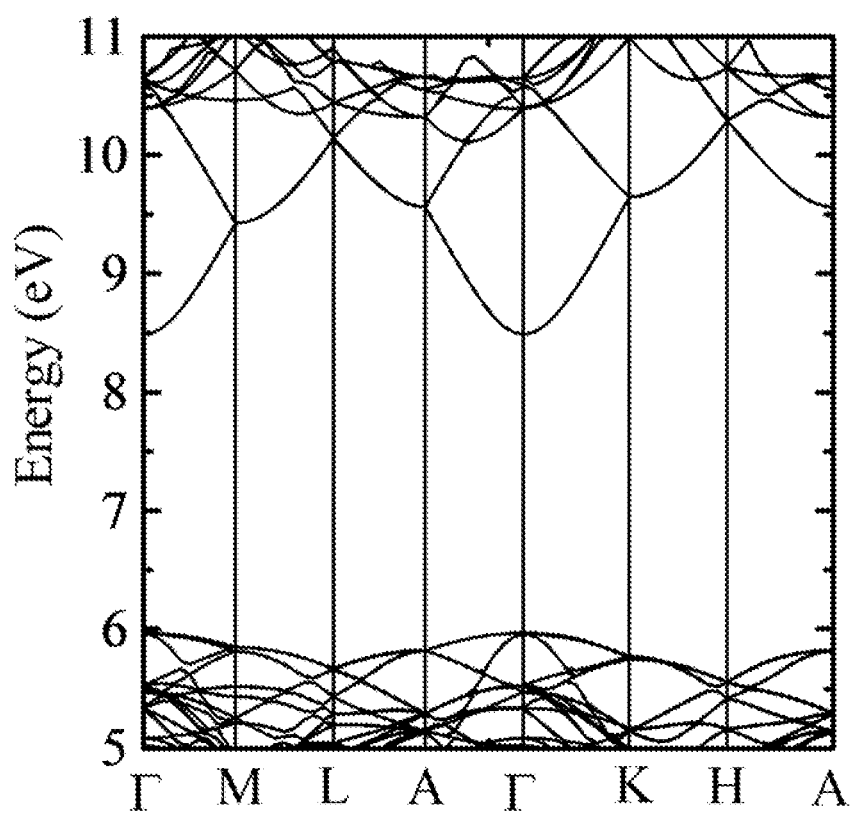
FIG. 14 is a diagram illustrating the function and effect of the semiconductor device and the semiconductor device manufacturing method according to the first embodiment.

FIGS. 13A, 13B, and 14 are diagrams illustrating a case in which VN and a carbon atom at the position of a nitrogen atom coexist. FIG. 13A is a diagram illustrating VN and a nitrogen atom in gallium nitride. FIG. 13B is a diagram illustrating a level when a carbon atom and VN calculated by the first principle calculation coexist.

FIG. 13A illustrates a state in which VN and a carbon atom are closest to each other when VN and the carbon atom coexist in gallium nitride. In other words, FIG. 13A illustrates a state in which one gallium atom has a dangling bond and is bonded to a carbon atom. The carbon atom, the atom X, and VN form a complex.

The first principle calculation proves that, when VN and a carbon atom coexist, a structure in which an electron moves from the donor level of VN to the acceptor level of the carbon atom is stabilized, as illustrated in FIG. 13B. At that time, the level formed by VN is moved to a conduction band and the level formed by the carbon atom is moved to a valence band. Therefore, the level in the bandgap of gallium nitride is removed, as illustrated in FIGS. 13B and 14.

In this embodiment, a carbon atom is provided at the position of a nitrogen atom in gallium nitride. The level in the bandgap of gallium nitride is removed by the interaction between VN and the carbon atom at the position of a nitrogen atom and the interaction between the carbon atom at the position of a nitrogen atom and a dangling bond at the interface between the barrier layer 16 and the insulating layer 22. Therefore, electron trap is prevented. As a result, it is possible to prevent current collapse.

The removal of the level in the bandgap of gallium nitride can be determined by, for example, deep level transient spectroscopy (DLTS).

When VN and the carbon atom at the position of a nitrogen atom coexist, the donor level and the acceptor level are removed. As a result, carriers are cancelled and carrier concentration is reduced. Therefore, the electric resistivity of gallium nitride increases.

Since electron trap immediately below the gate electrode 28 is prevented, a variation in the threshold voltage is prevented.

FIGS. 15A, 15B, 15C, and 15D are diagrams illustrating the function of the semiconductor device manufacturing method according to this embodiment.

Figure 15A:
FIGS. 15A, 15B, 15C, and 15D are diagrams illustrating the function of the semiconductor device manufacturing method according to the first embodiment.
Figure 15B:
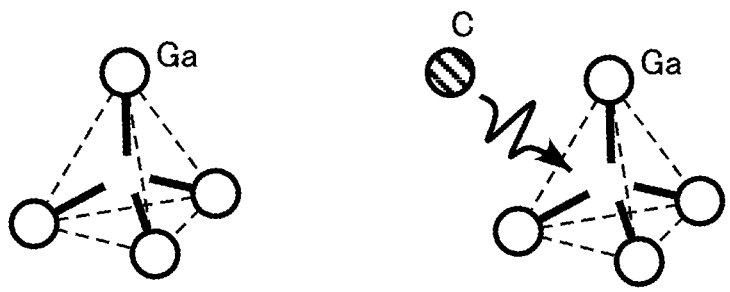

It is assumed that VN illustrated in FIG. 15A is present in gallium nitride. As illustrated in FIG. 15B, one carbon atom is introduced into gallium nitride by carbon ion implantation.

Figure 15C:
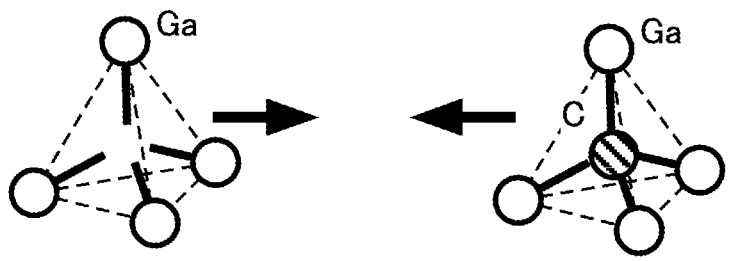
Figure 15D:
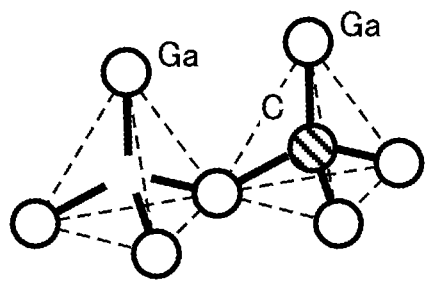

As illustrated in FIG. 15C, a carbon atom is introduced to VN and is located at the lattice position of a nitrogen atom. According to the first principle calculation, a carbon atom and VN are close to each other and the energy of the system is reduced. As a result, a stable structure is formed. Therefore, as illustrated in FIG. 15D, a structure in which a nitrogen atom and VN are close to each other is formed by the heat treatment. Specifically, for example, a structure in which one gallium atom has a dangling bond and is bonded to one carbon atom is formed. In other words, a complex of the carbon atom, the gallium atom, and VN is formed.

It is preferable that the heat treatment be performed at a high temperature after carbon ion implantation, in order to form the complex of the carbon atom, the gallium atom, and VN. The heat treatment temperature is preferably equal to or greater than 900° C. and equal to or less than 1200° C. and more preferably equal to or greater than 1000° C.

VN is formed in gallium nitride in order to increase entropy. For example, it is assumed that the amount of carbon more than the amount of VN in gallium nitride is introduced by carbon ion implantation. In this case, theoretically, since the same amount of VN as the amount of carbon introduced forms a complex, no VN is independently present. When the heat treatment is performed for a long time, the same amount of VN as the remaining amount of carbon is newly generated in order to form a complex. The new VN forms a complex to stabilize the system. Therefore, the amount of carbon atoms or VN which remains independently in gallium nitride without forming a complex is very small.

For example, it is assumed that the amount of carbon less than the amount of VN in gallium nitride is introduced by carbon ion implantation. In this case, theoretically, the same amount of VN as the amount of carbon introduced forms a complex. Surplus VN remains in the gallium nitride. There is a concern that current collapse and a variation in the threshold voltage will occur due to the donor level in the bandgap formed by the remaining VN.

After a sufficient amount of carbon is introduced, the heat treatment is performed at a high temperature for a sufficient period of time to form the high-resistance region 16b. In other words, when a sufficient thermal budget is applied after a sufficient amount of carbon is introduced, it is possible to form the high-resistance region 16b. When a sufficient amount of carbon is not introduced or when a sufficient thermal budget is not applied by the heat treatment, it is difficult to form the high-resistance region 16b.

In the manufacturing method according to this embodiment, after the heat treatment, the insulating layer 21 which is used as a through film for carbon ion implantation is removed. When the insulating layer 21 is made of silicon oxide, nitrogen is diffused into the insulating layer 21 by the heat treatment and silicon oxide is changed to silicon oxynitride.

After the insulating layer 21 is removed, the heat treatment may be performed. In this case, nitrogen is effectively emitted from the barrier layer 16, which makes it easy to form VN.

In addition to the silicon oxide, silicon oxynitride or silicon nitride may be used for the insulating layer 21 which is a through film. In particular, when silicon nitride with high density is used, carbon ion blocking capability during ion implantation is improved. Therefore, it is easy to set an accelerating voltage such that the projected range (RP) of carbon ions is located in the vicinity of the interface between the barrier layer 16 and the insulating layer 21.

It is considered that the concentration of VN in gallium nitride is equal to or greater than about $1\times10^{18}$ cm$^{-3}$ and equal to or less than about $1\times10^{19}$ cm$^{-3}$. The carbon concentration of the high-resistance region 16b is preferably equal to or greater than $1\times10^{19}$ cm$^{-3}$, more preferably equal to or greater than $1\times10^{20}$ cm$^{-3}$, and most preferably equal to or greater than $1\times10^{21}$ cm$^{-3}$, in order to prevent the generation of surplus VN.

As described above, since the amount of carbon is more than the amount of VN in gallium nitride in an initial stage, it is possible to control the level in the bandgap. When the heat treatment is performed at a high temperature for a sufficiently long period of time after a sufficient amount of carbon is introduced, the amount of carbon and the amount of VN are equal to each other and have the same distribution, which makes it easy to form the high-resistance region 16b.

The manufacturing method according to this embodiment has the following characteristics (1) to (3). (1) The amount of carbon increases and VN is additionally formed by the heat treatment. At that time, it is preferable that the heat treatment be performed at a sufficiently high temperature for a sufficiently long period of time, that is, a sufficient thermal budget be applied. (2) The insulating layer 21 used as a through film is removed after the heat treatment for forming the high-resistance region 16b or before the heat treatment. In the former case, nitrogen which is emitted from the barrier layer 16 and is then introduced into the insulating layer 21 is removed. In the latter case, the emission efficiency of nitrogen from the barrier layer 16 is improved. (3) Since the insulating layer 21 is used as a through film during carbon ion implantation, it is easy to set an accelerating voltage such that the projected range (RP) of carbon ions is located in the vicinity of the interface between the barrier layer 16 and the insulating layer 21. When the through film is not provided, it is difficult to introduce carbon into the vicinity of the surface of the barrier layer 16, for example, a region that is about several nanometers away from the surface. For example, since RP is located in the through film, it is possible to introduce carbon only to the vicinity of the surface of the barrier layer 16. For example, when silicon nitride with high density is used for the insulating layer 21, carbon can be introduced only to the vicinity of the surface of the barrier layer 16 with a steep profile by ion implantation. Since the through film is removed, surplus carbon introduced by ion implantation does not remain after the semiconductor device is completed.

In the manufacturing method according to this embodiment, after carbon ions are implanted, the insulating layer 21 is removed by wet etching. Impurities, such as carbon, gallium, or aluminum, included in the insulating layer 21 are removed together with the insulating layer 21. Therefore, charge trap at the level formed by impurities, such as nitrogen, carbon, gallium, or aluminum, included in the insulating layer 21 is prevented. As a result, it is possible to prevent, for example, current collapse, a variation in the threshold voltage, and an increase in leakage current caused by charge trap in the insulating layer 21.

FIGS. 9A, 9B, 10, 11A, 11B, 12, 13A, 13B, 14, 15A, 15B, 15C, and 15D illustrate an example in which the atom X other than a nitrogen atom forming the nitride semiconductor layer is a gallium atom. That is, an example in which the nitride semiconductor layer is made of gallium nitride has been described. However, in the other GaN-based semiconductors in which some or all of the gallium atoms in gallium nitride are substituted with aluminum or indium atoms, the same function as that generated in gallium nitride is generated. That is, even when the atom X is an aluminum or indium atom, the same function as that when the atom X is a gallium atom is generated.

In this embodiment, when a carbon atom is formed at the position of a nitrogen atom, the heat treatment temperature is preferably equal to or greater than 900° C. and more preferably equal to or greater than 1000° C. Since the heat treatment is performed at a high temperature, it is possible to reduce the distance between VN and a carbon atom to a value at which VN and the carbon atom interact with each other.

According to the semiconductor device and the semiconductor device manufacturing method of this embodiment, since the level in the bandgap is reduced, it is possible to prevent current collapse. In addition, since the level in the bandgap is reduced, it is possible to prevent a variation in the threshold voltage. Therefore, it is possible to achieve a semiconductor device with high reliability.

Second Embodiment

A semiconductor device according to this embodiment differs from the semiconductor device according to the first embodiment in that the second region includes at least one element selected from the group consisting of oxygen (O), sulfur (S), selenium (Se), and tellurium (Te).

In addition, the semiconductor device according to this embodiment differs from the semiconductor device according to the first embodiment in that it includes an atom X which forms a bond with a carbon atom and forms a bond with a first atom of at least one element selected from the group consisting of oxygen (O), sulfur (S), selenium (Se), and tellurium (Te).

The semiconductor device according to this embodiment differs from the semiconductor device according to the first embodiment in that it includes a first atom at the position of a nitrogen atom, instead of VN in the first embodiment. Hereinafter, the description of the same content as that in the first embodiment will not be repeated.

The high-resistance region 16b illustrated in FIG. 1 includes one carbon atom at the lattice position of a nitrogen atom. For example, one carbon atom is introduced to the lattice position of a nitrogen atom in aluminum gallium nitride. The one carbon atom introduced to the lattice position of a nitrogen atom functions as an acceptor.

In addition, the high-resistance region 16b includes a first atom of at least one element selected from the group consisting of oxygen (O), sulfur (S), selenium (Se), and tellurium (Te). The first atom is present at the lattice position of a nitrogen atom. The first atom functions as a donor.

The carrier concentration of the high-resistance region 16b is lower than that of the low-resistance region 16a due to the interaction between the first atom functioning as a donor and the carbon atom functioning as an acceptor. Therefore, the electric resistivity of the high-resistance region 16b is higher than that of the low-resistance region 16a.

In the high-resistance region 16b, the first atom and the carbon atom are close to each other. In the high-resistance region 16b, the first atom and the carbon atom are so close that they electrically interact with each other.

It is assumed that an atom other than a nitrogen atom forming the barrier layer 16 is an atom X. In this case, the high-resistance region 16b includes the atom X that forms a bond with a carbon atom and forms a bond with the first atom. Since the atom X forms a bond with the carbon atom and forms a bond with the first atom, a structure in which the carbon atom and the first atom are closest to each other is achieved. In other words, the carbon atom, the atom X, and the first atom form a complex.

The bond between the atom X and the carbon atom, the bond between the atom X and the first atom, and a complex of the carbon atom, the atom X, and the first atom in the high-resistance region 16b can be measured by, for example, X-ray photoelectron spectroscopy, infrared spectroscopy, or Raman spectroscopy.

The carbon concentration of the high-resistance region 16b is, for example, equal to or greater than $1 \times 10^{19}$ cm$^{-3}$. The concentration of the first atom in the high-resistance region 16b is, for example, equal to or greater than $1 \times 10^{19}$ cm$^{-3}$. The concentration of carbon and the first atom in the high-resistance region 16b can be measured by, for example, secondary ion mass spectroscopy.

For example, the semiconductor device according to this embodiment can be manufactured by implanting the first atoms into the barrier layer 16, using ion implantation, at the same time as carbon ions are implanted into the barrier layer 16 in the semiconductor device manufacturing method according to the first embodiment.

For example, when the atom X is a gallium (Ga) atom and the first atom is an oxygen (O) atom, one gallium atom is bonded to one carbon atom and the same gallium atom is bonded to one oxygen atom. When the atom X is an aluminum (Al) atom, one aluminum atom is bonded to one carbon atom and the same aluminum atom is bonded to one oxygen atom.

Figure 16A:
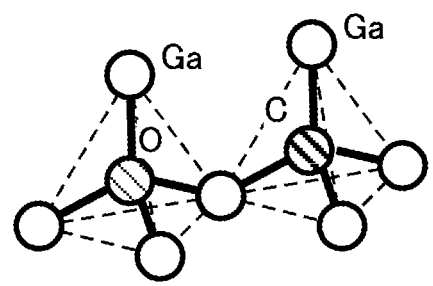
FIGS. 16A and 16B are diagrams illustrating the function of a semiconductor device according to a second embodiment.
Figure 16B:
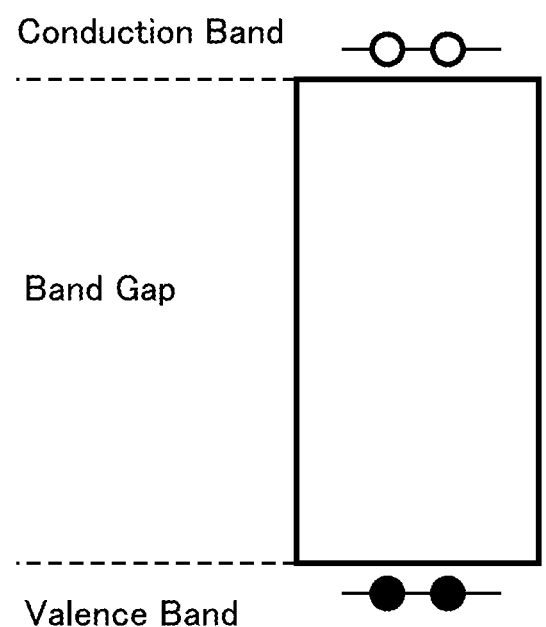

FIGS. 16A and 16B are diagrams illustrating the function of the semiconductor device according to this embodiment. FIG. 16A is a diagram schematically illustrating an oxygen atom and a carbon atom in gallium nitride. FIG. 16B is a diagram illustrating a level when the carbon atom and the oxygen atom calculated by the first principle calculation coexist.

As illustrated in FIG. 16A, an oxygen atom in gallium nitride is present at the lattice position of a nitrogen atom in gallium nitride. A carbon atom in gallium nitride is present at the lattice position of a nitrogen atom in gallium nitride. FIG. 16A illustrates a state in which an oxygen atom and a carbon atom are closest to each other when the oxygen atom and the carbon atom coexist in gallium nitride. In other words, one gallium atom is bonded to an oxygen atom and the same gallium atom is bonded to a carbon atom. The carbon atom, the atom X, and the oxygen atom form a complex.

The first principle calculation proves that, when an oxygen atom and a carbon atom coexist, a structure in which an electron moves from the donor level of the oxygen atom to the acceptor level of the carbon atom is stabilized, as illustrated in FIG. 16B. At that time, the level formed by the oxygen atom is moved to a conduction band and the level formed by the carbon atom is moved to a valence band. Therefore, the level in the bandgap of gallium nitride is removed, as illustrated in FIG. 16B.

In this embodiment, an oxygen atom is provided at the position of a nitrogen atom and a carbon atom is provided at the position of a nitrogen atom in gallium nitride. The level in the bandgap of gallium nitride is removed by the interaction between the oxygen atom and the carbon atom. Therefore, electron trap is prevented. As a result, it is possible to prevent current collapse.

The removal of the level in the bandgap of gallium nitride can be determined by, for example, DLTS.

When an oxygen atom and a carbon atom coexist, the donor level and the acceptor level are removed. As a result, carriers are cancelled and carrier concentration is reduced. Therefore, the electric resistivity of gallium nitride increases.

Since electron trap immediately below the gate electrode 28 is prevented, a variation in the threshold voltage is prevented.

VN is formed in gallium nitride in order to increase entropy. When a complex of a carbon atom, a gallium atom, and an oxygen atom is formed by carbon and oxygen ion implantation and a sufficient heat treatment, entropy increases. Therefore, theoretically, when the amount of complex is sufficient, VN is removed. When VN remains, there is a concern that current collapse and a variation in the threshold voltage will occur due to the donor level in the bandgap caused by the remaining VN.

For example, it is assumed that the amount of carbon more than the amount of VN in gallium nitride is introduced by carbon ion implantation. At that time, it is assumed that the amount of oxygen more than the amount of carbon is introduced by ion implantation. In this case, theoretically, VN is removed. However, surplus oxygen remains. There is a concern that current collapse and a variation in the threshold voltage will occur due to the donor level in the bandgap caused by the remaining oxygen.

For example, it is assumed that the amount of carbon more than the amount of VN in gallium nitride is introduced by carbon ion implantation. At that time, it is assumed that the amount of oxygen less than the amount of carbon is introduced by ion implantation. A sufficient amount of carbon is introduced such that the amount of carbon implanted is more than the sum of the amount of VN in gallium nitride and the amount of oxygen implanted.

In this case, when the amount of oxygen is more than the amount of VN, VN is filled with oxygen and is removed. Then, the same amount of VN as the amount of carbon which remains without forming a complex with oxygen is generated in order to form a complex with carbon. In other words, VN for compensating for surplus carbon is newly generated. Therefore, the amount of carbon atoms, oxygen atoms, or VN which remains independently in gallium nitride is very small.

In this case, when the amount of oxygen is less than the amount of VN, a sufficiently large amount of carbon is introduced. Therefore, surplus VN forms a complex with a carbon atom and no VN remains independently. Then, the same amount of VN as the amount of carbon which remains without forming a complex with oxygen is generated in order to form a complex with carbon. Therefore, the amount of carbon atoms, oxygen atoms, or VN which remains independently in gallium nitride is very small.

For example, it is assumed that the amount of carbon less than the amount of VN in gallium nitride is introduced by carbon ion implantation. At that time, it is assumed that the amount of oxygen more than the amount of carbon is introduced by ion implantation. In this case, theoretically, VN corresponding to a shortage of carbon remains independently. In addition, surplus oxygen remains independently. There is a concern that current collapse and a variation in the threshold voltage will occur due to the donor level in the bandgap caused by VN and oxygen which remain independently.

For example, it is assumed that the amount of carbon less than the amount of VN in gallium nitride is introduced by carbon ion implantation. At that time, it is assumed that the amount of oxygen less than the amount of carbon is introduced by ion implantation. In this case, no oxygen remains independently and VN corresponding to a shortage in carbon remains independently. There is a concern that current collapse and a variation in the threshold voltage will occur due to the donor level in the bandgap caused by VN which remains independently.

Therefore, it is preferable that the concentration of carbon in gallium nitride be higher than the concentration of VN before carbon or oxygen is introduced, in order to prevent current collapse and a variation in the threshold voltage. In addition, it is preferable that the concentration of carbon in gallium nitride be higher than the concentration of oxygen in gallium nitride.

It is considered that the concentration of VN in gallium nitride is equal to or greater than about $1 \times 10^{18}$ cm$^{-3}$ and equal to or less than about $1 \times 10^{19}$ cm$^{-3}$. The carbon concentration of the high-resistance region 16b is preferably equal to or greater than $1 \times 10^{19}$ cm$^{-3}$, more preferably equal to or greater than $1 \times 10^{20}$ cm$^{-3}$, and most preferably equal to or greater than $1 \times 10^{21}$ cm$^{-3}$, in order to prevent the generation of surplus VN. Since the amount of carbon is more than the amount of VN in gallium nitride, it is possible to control the level in the bandgap.

In this embodiment, instead of the oxygen atom, an atom of sulfur (S), selenium (Se), or tellurium (Te) which is a group 16 element and a bivalent element may be used as the first atom. In this case, the same effect as that when the first atom is an oxygen atom is obtained.

An energy gain obtained when a carbon atom and the first atom (O, S, Se, or Te) are close to each other is higher than that obtained when a carbon atom and VN are close to each other and high stability is obtained. The reason is that, when atoms are close to each other, it is possible to ensure the localization of charge and coulomb interaction is strong, as compared to when an atom and VN are close to each other.

The amount of first atoms or the distribution thereof can be controlled by ion implantation conditions. Therefore, it is easy to perform control such that the amount of carbon is substantially equal to the amount of first atoms or the distribution of carbon is equal to the distribution of the first atoms. Similarly to the first embodiment, for the first atom, a sufficient amount of carbon is introduced and a shortage of the first atoms can be supplemented with VN generated by a high-temperature heat treatment.

According to the semiconductor device and the semiconductor device manufacturing method of this embodiment, it is possible to prevent current collapse, similarly to the first embodiment. In addition, it is possible to achieve a semiconductor device with high reliability. It is possible to achieve a semiconductor device with a higher stability than that in the first embodiment. Furthermore, controllability during manufacture is higher than that in the first embodiment.

Third Embodiment

A semiconductor device according to this embodiment differs from the semiconductor device according to the first embodiment in that the second region includes at least one element selected from the group consisting of silicon (Si), germanium (Ge), titanium (Ti), zirconium (Zr), hafnium (Hf), and iron (Fe).

The semiconductor device according to this embodiment differs from the semiconductor device according to the first embodiment in that it includes an atom X which forms a bond with a carbon atom and forms a bond with a second atom of one element selected from the group consisting of silicon (Si), germanium (Ge), titanium (Ti), zirconium (Zr), hafnium (Hf), and iron (Fe).

The semiconductor device according to this embodiment differs from the semiconductor device according to the first embodiment in that it includes the second atom at the position of the atom X, instead of VN in the first embodiment. Hereinafter, the description of the same content as that in the first embodiment will not be repeated.

The high-resistance region 16b illustrated in FIG. 1 includes one carbon atom at the lattice position of a nitrogen atom. For example, one carbon atom is introduced to the lattice position of a nitrogen atom in aluminum gallium nitride. The one carbon atom introduced to the lattice position of a nitrogen atom functions as an acceptor.

When an atom other than a nitrogen atom forming the barrier layer 16 is an atom X, the high-resistance region 16b includes a second atom of at least one element selected from the group consisting of hafnium (Hf), silicon (Si), germanium (Ge), titanium (Ti), zirconium (Zr), and iron (Fe). The second atom is present at the lattice position of the atom X. The second atom functions as a donor.

The carrier concentration of the high-resistance region 16b is lower than that of the low-resistance region 16a due to the interaction between the second atom functioning as a donor and the carbon atom functioning as an acceptor. Therefore, the electric resistivity of the high-resistance region 16b is higher than that of the low-resistance region 16a.

In the high-resistance region 16b, the second atom and the carbon atom are close to each other. In the high-resistance region 16b, the second atom and the carbon atom are so close that they electrically interact with each other.

It is assumed that an atom other than a nitrogen atom forming the barrier layer 16 is the atom X. The second atom substitutes the atom X and the carbon atom substitutes a nitrogen atom adjacent to the atom X. In other words, the carbon atom and the second atom form a complex with a pair structure. As a back bond, the carbon atom forms three bonds with the atom X. In addition, as a back bond, the second atom forms three bonds with the nitrogen atom.

The bond between the atom X and the carbon atom, the bond between the nitrogen atom and the second atom, and a complex with a pair structure of the carbon atom and the second atom in the high-resistance region 16b can be measured by, for example, X-ray photoelectron spectroscopy, infrared spectroscopy, or Raman spectroscopy.

The carbon concentration of the high-resistance region 16b is, for example, equal to or greater than $1 \times 10^{19}$ cm$^{-3}$. The concentration of the second atom in the high-resistance region 16b is, for example, equal to or greater than $1 \times 10^{19}$ cm$^{-3}$. The concentration of carbon and the second atom in the high-resistance region 16b can be measured by, for example, secondary ion mass spectroscopy.

For example, the semiconductor device according to this embodiment can be manufactured by implanting the second atoms into the barrier layer 16, using ion implantation, at the same time as carbon ions are implanted into the barrier layer 16 in the semiconductor device manufacturing method according to the first embodiment.

For example, when the atom X is a gallium (Ga) atom and the second atom is a silicon (S) atom, three gallium atoms are bonded to one carbon atom and three nitrogen atoms are bonded to one silicon atom. The carbon atom and the silicon atom form a complex with a pair structure. When the atom X is an aluminum (Al) atom, three aluminum atoms are bonded to one carbon atom and three nitrogen atoms are bonded to one silicon atom. The carbon atom and the silicon atom form a complex with a pair structure.

Figure 17A:
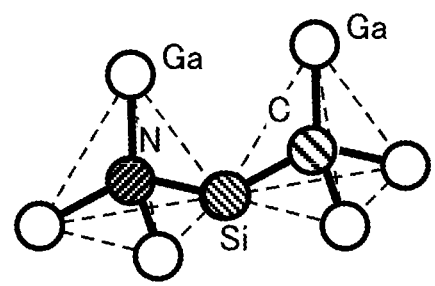
FIGS. 17A and 17B are diagrams illustrating the function of a semiconductor device according to a third embodiment.
Figure 17B:
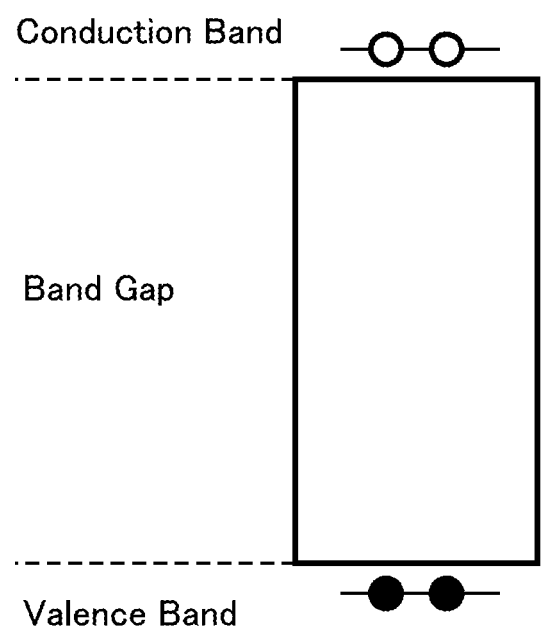

FIGS. 17A and 17B are diagrams illustrating the function of the semiconductor device according to this embodiment. FIG. 17A is a diagram schematically illustrating a silicon atom and a carbon atom in gallium nitride. FIG. 17B is a diagram illustrating a level when the carbon atom and the silicon atom calculated by the first principle calculation coexist.

As illustrated in FIG. 17A, a silicon atom in gallium nitride is present at the lattice position of a gallium atom in gallium nitride. A carbon atom in gallium nitride is present at the lattice position of a nitrogen atom in gallium nitride. FIG. 17A illustrates a state in which a silicon atom and a carbon atom are closest to each other when the silicon atom and the carbon atom coexist in gallium nitride. In other words, the silicon atom and the carbon atom form a complex with a pair structure.

The first principle calculation proves that, when a silicon atom and a carbon atom coexist, a structure in which an electron moves from the donor level of the silicon atom to the acceptor level of the carbon atom is stabilized, as illustrated in FIG. 17B. At that time, the level formed by the silicon atom is moved to a conduction band and the level formed by the carbon atom is moved to a valence band. Therefore, the level in the bandgap of gallium nitride is removed, as illustrated in FIG. 17B.

In this embodiment, a silicon atom is provided at the position of a gallium atom and a carbon atom is provided at the position of a nitrogen atom in gallium nitride. The level in the bandgap of gallium nitride is removed by the interaction between the silicon atom and the carbon atom. Therefore, electron trap is prevented. As a result, it is possible to prevent current collapse.

The removal of the level in the bandgap of gallium nitride can be determined by, for example, DLTS.

When a silicon atom and a carbon atom coexist, the donor level and the acceptor level are removed. As a result, carriers are cancelled and carrier concentration is reduced. Therefore, the electric resistivity of gallium nitride increases.

Since electron trap immediately below the gate electrode 28 is prevented, a variation in the threshold voltage is prevented.

VN is formed in gallium nitride in order to increase entropy. When a complex with a pair structure of a carbon atom and a silicon atom is formed by carbon and silicon ion implantation and a sufficient heat treatment, entropy increases. Therefore, theoretically, when the amount of complex with a pair structure is sufficient, VN is removed. When VN remains, there is a concern that current collapse and a variation in the threshold voltage will occur due to the donor level in the bandgap caused by the remaining VN.

For example, it is assumed that the amount of carbon more than the amount of VN in gallium nitride is introduced by carbon ion implantation. At that time, it is assumed that the amount of silicon more than the amount of carbon is introduced by ion implantation. In this case, theoretically, VN is removed. However, surplus silicon remains. There is a concern that current collapse and a variation in the threshold voltage will occur due to the donor level in the bandgap caused by the remaining silicon.

For example, it is assumed that the amount of carbon more than the amount of VN in gallium nitride is introduced by carbon ion implantation. At that time, it is assumed that the amount of silicon less than the amount of carbon is introduced by ion implantation.

In this case, it is assumed that, since the amount of carbon is more than the amount of VN, once VN is removed. Then, the same amount of VN as the amount of carbon which remains without forming a pair structure with silicon is generated in order to form a complex with carbon. In other words, VN for compensating for surplus carbon which does not form a pair structure with silicon is newly generated. Therefore, the amount of carbon atoms, silicon atoms, or VN which remains independently in gallium nitride is very small.

In this case, when the amount of silicon is less than the amount of VN, a sufficiently large amount of carbon is introduced. Therefore, surplus VN forms a complex with a carbon atom and no VN remains independently. Then, the same amount of VN as the amount of carbon which remains without forming a complex with silicon is newly generated in order to form a complex with carbon. Therefore, the amount of carbon atoms, silicon atoms, or VN which remains independently in gallium nitride is very small.

For example, it is assumed that the amount of carbon less than the amount of VN in gallium nitride is introduced by carbon ion implantation. At that time, it is assumed that the amount of silicon more than the amount of carbon is introduced by ion implantation. In this case, theoretically, VN corresponding to a shortage of carbon remains independently. In addition, surplus silicon remains independently. There is a concern that current collapse and a variation in the threshold voltage will occur due to the donor level in the bandgap caused by VN and silicon which remain independently.

For example, it is assumed that the amount of carbon less than the amount of VN in gallium nitride is introduced by carbon ion implantation. At that time, it is assumed that the amount of silicon less than the amount of carbon is introduced by ion implantation. In this case, no silicon remains independently and VN corresponding to a shortage in carbon remains independently. There is a concern that current collapse and a variation in the threshold voltage will occur due to the donor level in the bandgap caused by VN which remains independently.

Therefore, it is preferable that the concentration of carbon in gallium nitride be higher than the concentration of VN before carbon or silicon is introduced, in order to prevent current collapse and a variation in the threshold voltage. In addition, it is preferable that the concentration of carbon in gallium nitride be higher than the concentration of silicon in gallium nitride.

It is considered that the concentration of VN in gallium nitride is equal to or greater than about $1 \times 10^{18}$ cm$^{-3}$ and equal to or less than about $1 \times 10^{19}$ cm$^{-3}$. The carbon concentration of the high-resistance region 16b is preferably equal to or greater than $1 \times 10^{19}$ cm$^{-3}$, more preferably equal to or greater than $1 \times 10^{20}$ cm$^{-3}$, and most preferably equal to or greater than $1 \times 10^{21}$ cm$^{-3}$, in order to prevent the generation of surplus VN. Since the amount of carbon is more than the amount of VN in gallium nitride, it is possible to control the level in the bandgap.

In this embodiment, instead of the silicon atom, an atom of germanium (Ge), titanium (Ti), zirconium (Zr), hafnium (Hf), or iron (Fe) may be used as the second atom. In this case, the same effect as that when the second atom is a silicon atom is obtained.

An energy gain obtained when a carbon atom and the second atom (Si, Ge, Ti, Zr, Hf, or Fe) are close to each other is higher than that obtained when a carbon atom and VN are close to each other and high stability is obtained. The reason is that, when atoms are close to each other, it is possible to ensure the localization of charge and coulomb interaction is strong, as compared to when an atom and VN are close to each other. In addition, the second atom can move to the position where the second atom directly forms a bond with a carbon atom and is much closer to a carbon atom than VN or the first atom. Therefore, coulomb force further increases.

The amount of second atoms or the distribution thereof can be controlled by ion implantation conditions. Therefore, it is easy to perform control such that the amount of carbon is substantially equal to the amount of second atoms or the distribution of carbon is equal to the distribution of the second atoms. Similarly to the first embodiment, for the second atom, a sufficient amount of carbon is introduced and a shortage of the second atoms can be supplemented with VN generated by a high-temperature heat treatment.

According to the semiconductor device and the semiconductor device manufacturing method of this embodiment, it is possible to prevent current collapse, similarly to the first embodiment. In addition, it is possible to achieve a semiconductor device with high reliability. It is possible to achieve a semiconductor device with a higher stability than that in the first and second embodiments. Furthermore, controllability during manufacture is higher than that in the first embodiment.

Fourth Embodiment

A semiconductor device according to this embodiment differs from the semiconductor device according to the first to third embodiments in that it includes a nitride semiconductor layer, an insulating layer provided on the nitride semiconductor layer, and a region which is provided in an insulating-layer-side portion of the nitride semiconductor layer and includes an atom Y having a dangling bond, an atom Y forming a bond with a first atom of at least one element selected from the group consisting of oxygen (O), sulfur (S), selenium (Se), and tellurium (Te), or an atom Y forming a bond with a second atom of at least one element selected from the group consisting of silicon (Si), germanium (Ge), titanium (Ti), zirconium (Zr), hafnium (Hf), and iron (Fe). The atom Y is an atom of at least one element selected from the group consisting of beryllium (Be), magnesium (Mg), calcium (Ca), strontium (Sr), barium (Ba), zinc (Zn), and cadmium (Cd).

The semiconductor device according to this embodiment differs from the semiconductor device according to the first embodiment using the nitrogen defect (VN) in that it includes a region in which the atom Y and VN form a complex with a pair structure.

Alternatively, the semiconductor device according to this embodiment differs from the semiconductor device according to the second embodiment using the first atom in that it includes a region in which the atom Y and the first atom of at least one element selected from the group consisting of oxygen (O), sulfur (S), selenium (Se), and tellurium (Te) form a complex with a pair structure.

Alternatively, the semiconductor device according to this embodiment differs from the semiconductor device according to the third embodiment using the second atom in that it includes a region in which the atom Y and the second atom of at least one element selected from the group consisting of silicon (Si), germanium (Ge), titanium (Ti), zirconium (Zr), hafnium (Hf), and iron (Fe) form a complex with a pair structure.

In the first to third embodiments, the carbon atom substitutes the nitrogen atom and functions as an acceptor. However, in this embodiment, the atom Y substitutes, for example, a gallium atom and functions as an acceptor. This point is the difference from the first to third embodiments. That is, an acceptor formation mechanism is different from that in the first to third embodiments.

The semiconductor device according to this embodiment differs from the semiconductor device according to the first to third embodiments in that it includes the atom Y at the position of the atom X which is an atom other than a nitrogen atom forming the crystal structure of the nitride semiconductor layer, instead of the carbon atom in the first to third embodiments. Hereinafter, the description of the same content as that in the first to third embodiments will not be repeated.

In this embodiment, the same function and effect as those in the first to third embodiments are obtained. That is, VN, the first atom, or the second atom which functions as a donor and the atom Y which functions as an acceptor form a complex with a pair structure. Therefore, a level in the bandgap of the silicon carbide layer is removed. In other words, the level in the bandgap of the silicon carbide layer is removed by the interaction between VN, the first atom, or the second atom functioning as a donor and the atom Y functioning as an acceptor.

Figure 18A:
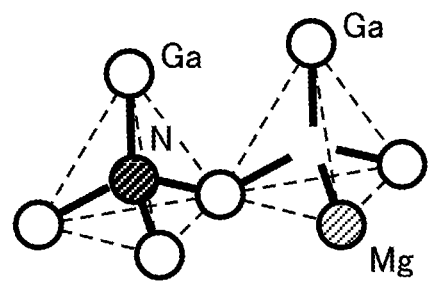
FIGS. 18A, 18B, and 18C are diagrams illustrating a semiconductor device according to a fourth embodiment.
Figure 18B:
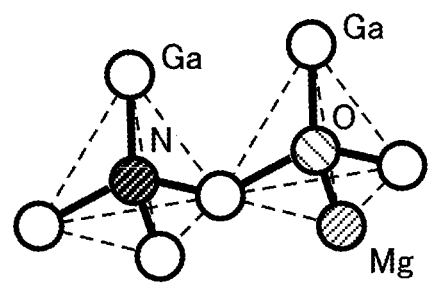
Figure 18C:
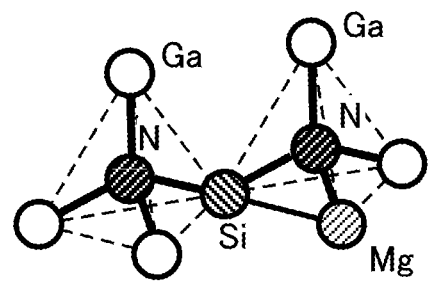

FIGS. 18A, 18B, and 18C are diagrams illustrating the semiconductor device according to this embodiment. FIG. 18A is a diagram illustrating a first example, FIG. 18B is a diagram illustrating a second example, and FIG. 18C is a diagram illustrating a third example.

Next, the first example will be described.

The high-resistance region (region) 16b illustrated in FIG. 1 includes an atom Y which is an atom of at least one element selected from the group consisting of beryllium (Be), magnesium (Mg), calcium (Ca), strontium (Sr), barium (Ba), zinc (Zn), and cadmium (Cd) and is present at the lattice position of the atom X. For example, one atom Y is introduced to the lattice position of a gallium atom in aluminum gallium nitride. The one atom Y introduced to the lattice position of the gallium atom functions as an acceptor.

A nitrogen defect (VN) is present in the high-resistance region 16b. The nitrogen defect (VN) functions as a donor.

As illustrated in FIG. 18A, for example, it is assumed that the atom X is a gallium (Ga) atom and the atom Y is a magnesium (Mg) atom. The magnesium atom substitutes the gallium atom and VN and the magnesium atom are adjacent to each other and form a complex with a pair structure. In other words, the magnesium atom has a dangling bond.

According to the first example, a level in the bandgap of a nitride semiconductor is removed by the same function as that in the first embodiment. Therefore, electron trap is prevented. As a result, it is possible to prevent current collapse and a variation in the threshold voltage.

In the first example, instead of the magnesium atom, an atom of beryllium (Be), calcium (Ca), strontium (Sr), barium (Ba), zinc (Zn), or cadmium (Cd) which is a group-II element and is a bivalent element may be used as the atom Y. In this case, the same effect as that when the atom Y is a magnesium atom is obtained.

Next, a second example will be described.

The high-resistance region (region) 16b illustrated in FIG. 1 includes an atom Y which is an atom of at least one element selected from the group consisting of beryllium (Be), magnesium (Mg), calcium (Ca), strontium (Sr), barium (Ba), zinc (Zn), and cadmium (Cd) and is present at the lattice position of the atom X. For example, one atom Y is introduced to the lattice position of a gallium atom in aluminum gallium nitride. The one atom Y introduced to the lattice position of the gallium atom functions as an acceptor.

In addition, the high-resistance region 16b includes a first atom of at least one element selected from the group consisting of oxygen (O), sulfur (S), selenium (Se), and tellurium (Te). The first atom is present at the lattice position of a nitrogen atom. The first atom functions as a donor.

As illustrated in FIG. 18B, for example, it is assumed that the atom X is a gallium (Ga) atom, the atom Y is a magnesium (Mg) atom, and the first atom is an oxygen (O) atom. The magnesium atom substitutes the gallium atom and the oxygen atom substitutes a nitrogen atom adjacent to the magnesium atom. Then, the magnesium atom and the oxygen atom are bonded to each other to form a complex with a pair structure.

According to the second example, a level in the bandgap of a nitride semiconductor is removed by the same function as that in the second embodiment. Therefore, electron trap is prevented. As a result, it is possible to prevent current collapse and a variation in the threshold voltage.

In the second example, instead of the magnesium atom, an atom of beryllium (Be), calcium (Ca), strontium (Sr), barium (Ba), zinc (Zn), or cadmium (Cd) which is a group-II element and is a bivalent element may be used as the atom Y. In this case, the same effect as that when the atom Y is a magnesium atom is obtained.

In the second example, instead of the oxygen atom, an atom of sulfur (S), selenium (Se), or tellurium (Te) which is a group 16 element and is a bivalent element may be used as the first atom. In this case, the same effect as that when the first atom is an oxygen atom is obtained.

Next, a third example will be described.

The high-resistance region (region) 16b illustrated in FIG. 1 includes an atom Y which is an atom of at least one element selected from the group consisting of beryllium (Be), magnesium (Mg), calcium (Ca), strontium (Sr), barium (Ba), zinc (Zn), and cadmium (Cd) and is present at the lattice position of the atom X. For example, one atom Y is introduced to the lattice position of a gallium atom in aluminum gallium nitride. The one atom Y introduced to the lattice position of the gallium atom functions as an acceptor.

In addition, the high-resistance region 16b includes a second atom of at least one element selected from the group consisting of silicon (Si), germanium (Ge), titanium (Ti), zirconium (Zr), hafnium (Hf), and iron (Fe). The second atom is present at the lattice position of the atom X. The second atom functions as a donor.

As illustrated in FIG. 18C, for example, it is assumed that the atom X is a gallium (Ga) atom, the atom Y is a magnesium (Mg) atom, and the second atom is a silicon (Si) atom. The magnesium atom and the silicon atom substitute gallium atoms. The magnesium atom and the silicon atom are bonded to each other to form a complex with a pair structure.

According to the third example, a level in the bandgap of a nitride semiconductor is removed by the same function as that in the third embodiment. Therefore, electron trap is prevented. As a result, it is possible to prevent current collapse and a variation in the threshold voltage.

In the third example, instead of the magnesium atom, an atom of beryllium (Be), calcium (Ca), strontium (Sr), barium (Ba), zinc (Zn), or cadmium (Cd) which is a group-II element and is a bivalent element may be used as the atom Y. In this case, the same effect as that when the atom Y is a magnesium atom is obtained.

In the third example, instead of the silicon atom, an atom of germanium (Ge), titanium (Ti), zirconium (Zr), hafnium (Hf), or iron (Fe) may be used as the second atom. In this case, the same effect as that when the second atom is a silicon atom is obtained.

According to the semiconductor device of this embodiment, it is possible to prevent current collapse, similarly to the first to third embodiments. In addition, it is possible to achieve a semiconductor device with high reliability.

Fifth Embodiment

A semiconductor device according to this embodiment is the same as the semiconductor device according to the first embodiment except that the p-type layer comes into contact with the nitride semiconductor layer. Therefore, the description of the same content as that in the first embodiment will not be repeated.

Figure 19:
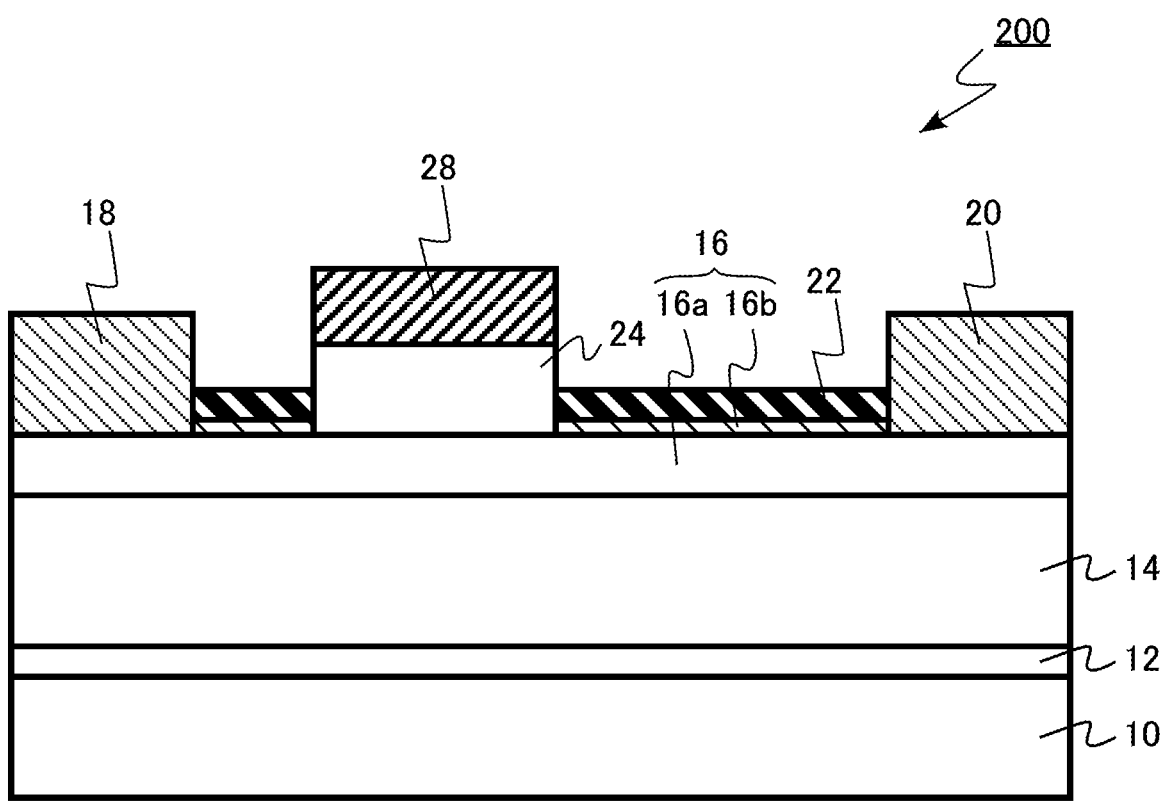
FIG. 19 is a cross-sectional view schematically illustrating a semiconductor device according to a fifth embodiment.

FIG. 19 is a cross-sectional view schematically illustrating the semiconductor device according to this embodiment. The semiconductor device according to this embodiment is an HEMT using a GaN-based semiconductor.

In an HEMT (semiconductor device) 200, a p-type layer 24 is provided so as to come into contact with the barrier layer 16. The p-type layer 24 comes into contact with the low-resistance region 16a. The p-type layer 24 is, for example, a single-crystal gallium nitride (GaN) layer.

According to the semiconductor device of this embodiment, similarly to the first embodiment, a level in the bandgap is reduced to prevent current collapse. In addition, the level in the bandgap is reduced to prevent a variation in the threshold voltage. Therefore, it is possible to achieve a semiconductor device with high reliability.

Sixth Embodiment

A semiconductor device according to this embodiment is the same as the semiconductor device according to the first embodiment except that the gate electrode comes into contact with the nitride semiconductor layer. Therefore, the description of the same content as that in the first embodiment will not be repeated.

Figure 20:
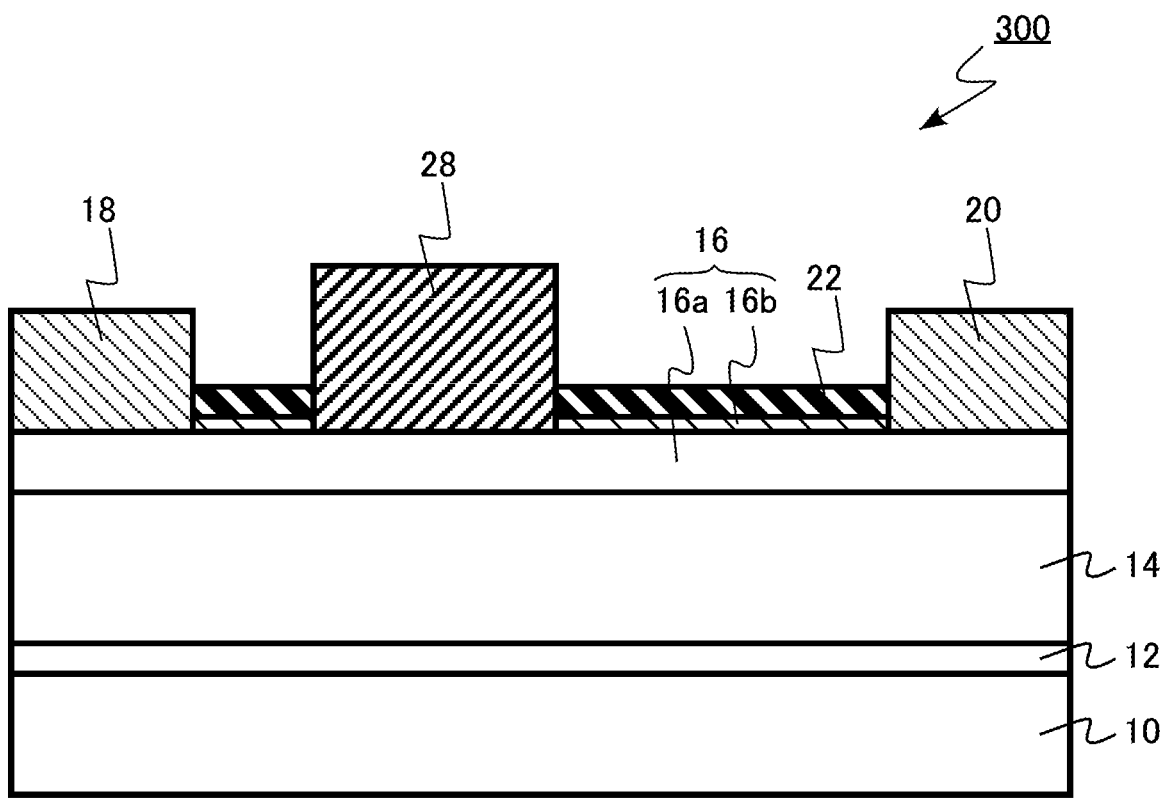
FIG. 20 is a cross-sectional view schematically illustrating a semiconductor device according to a sixth embodiment.

FIG. 20 is a cross-sectional view schematically illustrating the semiconductor device according to this embodiment. The semiconductor device according to this embodiment is an HEMT using a GaN-based semiconductor.

In an HEMT (semiconductor device) 300, agate electrode 28 is provided so as to come into contact with the barrier layer 16. The gate electrode 28 comes into contact with the low-resistance region 16a.

The gate electrode 28 is, for example, a metal electrode. The gate electrode 28 is made of, for example, titanium nitride (TiN).

The junction between the gate electrode 28 and the barrier layer 16 is a Schottky junction. The HEMT 300 is a normally-on transistor.

According to the semiconductor device of this embodiment, similarly to the first embodiment, a level in the bandgap is reduced to prevent current collapse. In addition, the level in the bandgap is reduced to prevent a variation in the threshold voltage. Therefore, it is possible to achieve a semiconductor device with high reliability.

Seventh Embodiment

A semiconductor device according to this embodiment is the same as the semiconductor device according to the first embodiment except that it has a so-called gate recess structure in which a gate electrode is buried in a recess formed in a barrier layer. Therefore, the description of the same content as that in the first embodiment will not be repeated.

Figure 21:
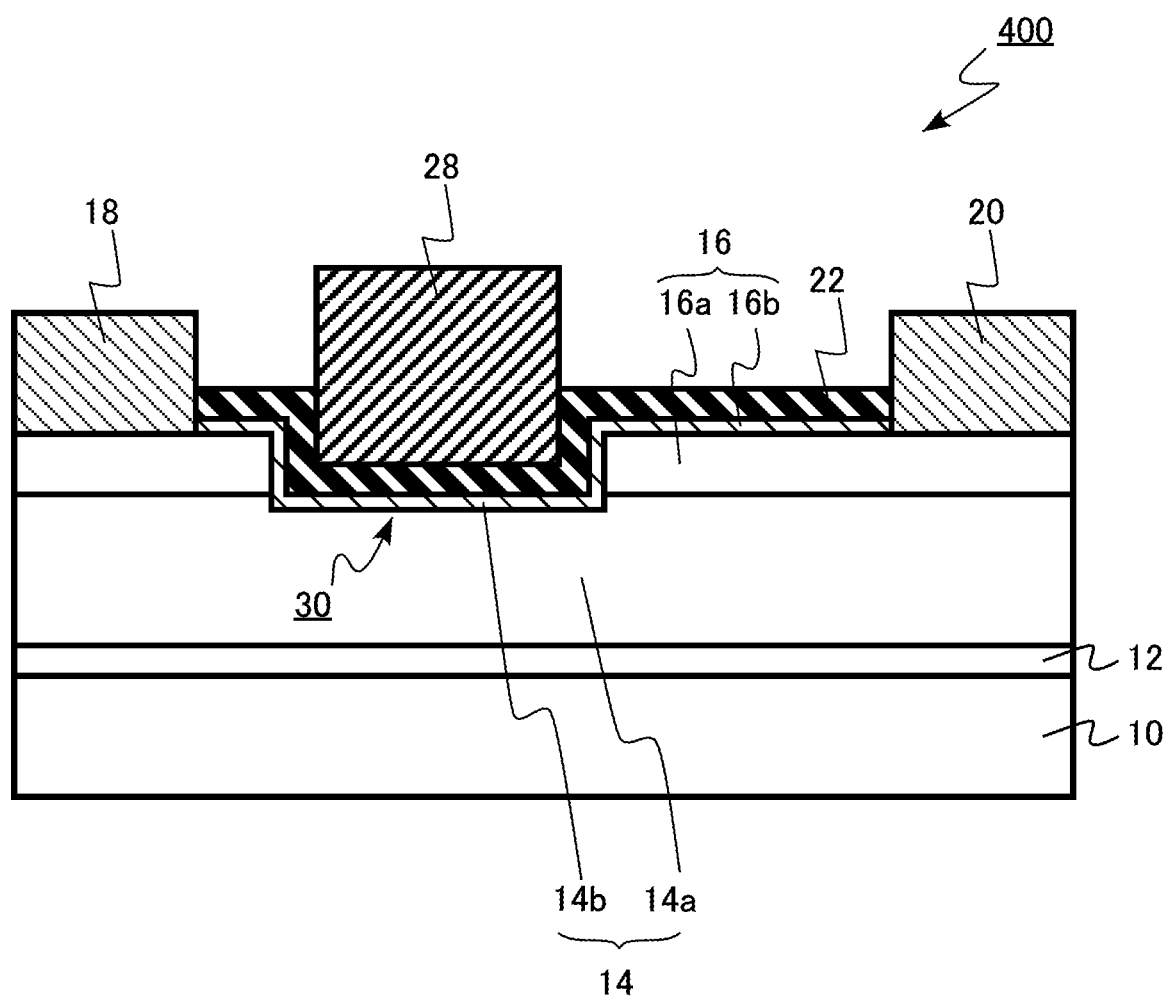
FIG. 21 is a cross-sectional view schematically illustrating a semiconductor device according to a seventh embodiment.

FIG. 21 is a cross-sectional view schematically illustrating the semiconductor device according to this embodiment.

In an HEMT (semiconductor device) 400, a high-resistance region 14b and the insulating layer 22 are formed on the inner surface of a recess 30 that is provided in the barrier layer 16 between the source electrode 18 and the drain electrode 20. In addition, the high-resistance region 16b is provided.

The bottom of a recess 30 is located in the channel layer 14. The high-resistance region 14b provided at the bottom of the recess 30 is formed in the channel layer 14. A low-resistance region 14a and the high-resistance region 14b form the channel layer 14.

According to the semiconductor device of this embodiment, a level in the bandgap is reduced to prevent current collapse, similarly to the first embodiment. In addition, the level in the bandgap is reduced to prevent a variation in the threshold voltage. Therefore, it is possible to achieve a semiconductor device with high reliability. In addition, since the semiconductor device has the gate recess structure, it is easy to achieve a normally-off transistor.

Eighth Embodiment

A semiconductor device according to this embodiment differs from the semiconductor device according to the seventh embodiment in that the barrier layer is provided below the recess. Hereinafter, the description of the same content as that in the seventh embodiment will not be repeated.

Figure 22:
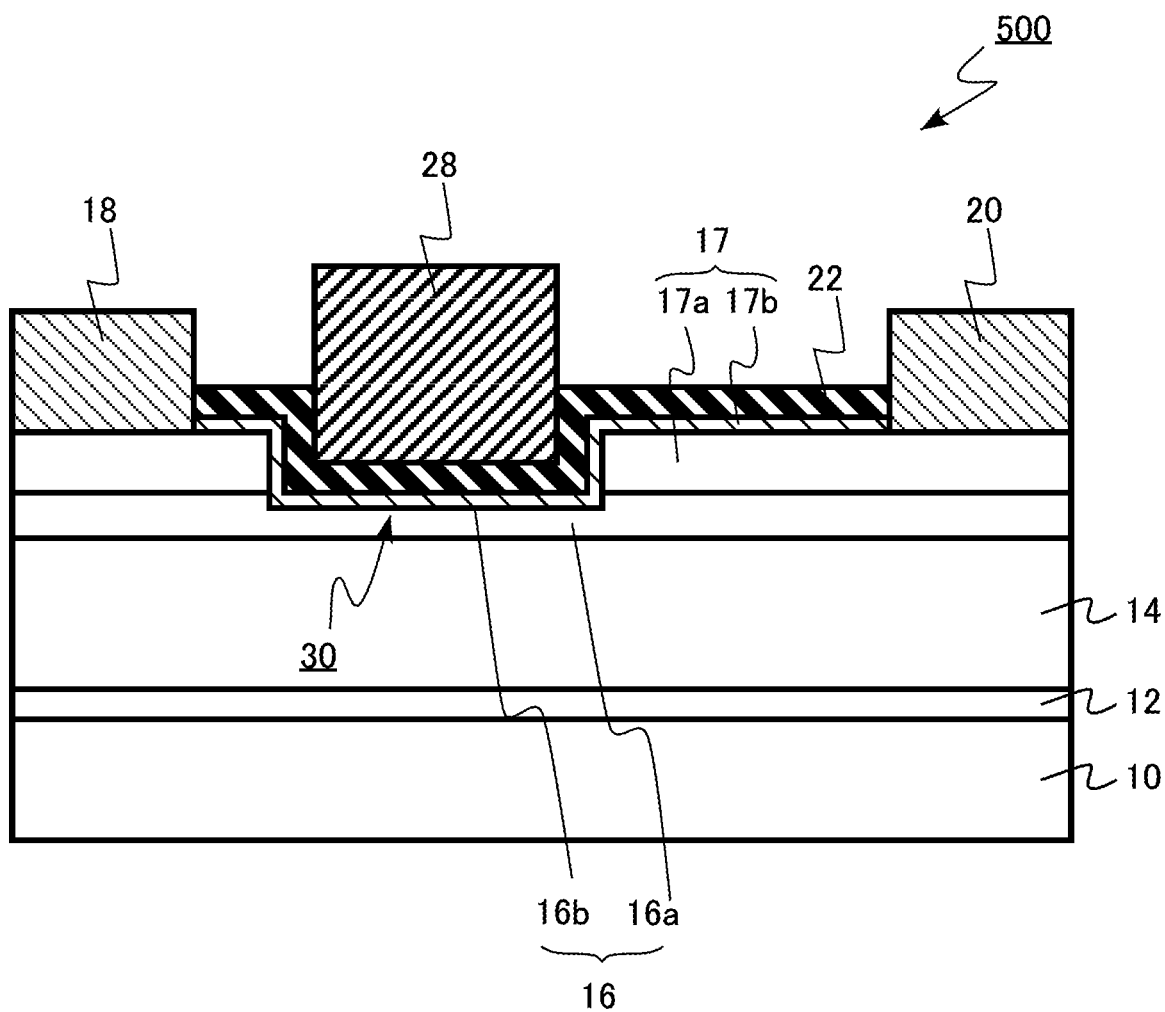
FIG. 22 is a cross-sectional view schematically illustrating a semiconductor device according to an eighth embodiment.

FIG. 22 is a cross-sectional view schematically illustrating the semiconductor device according to this embodiment.

In an HEMT (semiconductor device) 500, the barrier layer 16 is provided at the bottom of the recess 30. The barrier layer 16 is provided on the channel layer 14. A protective layer 17 made of nitride semiconductor is provided on both sides of the recess 30. The protective layer 17 is formed on the barrier layer 16 by, for example, selective epitaxial growth.

The channel layer 14 is made of, for example, GaN. The barrier layer 16 is, for example, an $Al_{0.1}Ga_{0.9}N$ layer with a thickness of 10 nm. The protective layer 17 is, for example, an $Al_{0.2}Ga_{0.8}N$ layer with a thickness of 20 nm.

In the HEMT 500, the high-resistance region 16b and the insulating layer 22 are formed on the inner surface of the recess 30. The low-resistance region 16a and the high-resistance region 16b form the barrier layer 16.

The insulating layer 22 is also formed between the source electrode 18 and the drain electrode 20. In addition, a low-resistance region 17a and a high-resistance region 17b are provided between the barrier layer 16 and the insulating layer 22.

The HEMT 500 is a normally-off transistor. A back barrier layer (not illustrated) which is made of a GaN-based semiconductor and has a higher bandgap than the channel layer 14 may be provided in at least a portion between the buffer layer 12 and the channel layer 14 in order to increase the threshold voltage of the HEMT 500. The back barrier layer is made of, for example, $Al_{0.1}Ga_{0.9}N$. The back barrier layer may be doped with, for example, Mg such that it is a p type.

In addition, a p-type layer (not illustrated) made of a p-type GaN-based semiconductor may be provided at the bottom of the recess 30 in order to increase the threshold voltage of the HEMT 500. The p-type layer is made of, for example, p-type GaN.

According to the semiconductor device of this embodiment, similarly to the first embodiment, a level in the bandgap is reduced to prevent current collapse. In addition, the level in the bandgap is reduced to prevent a variation in the threshold voltage. Therefore, it is possible to achieve a semiconductor device with high reliability.

Ninth Embodiment

A power circuit and a computer according to this embodiment include an HEMT.

Figure 23:
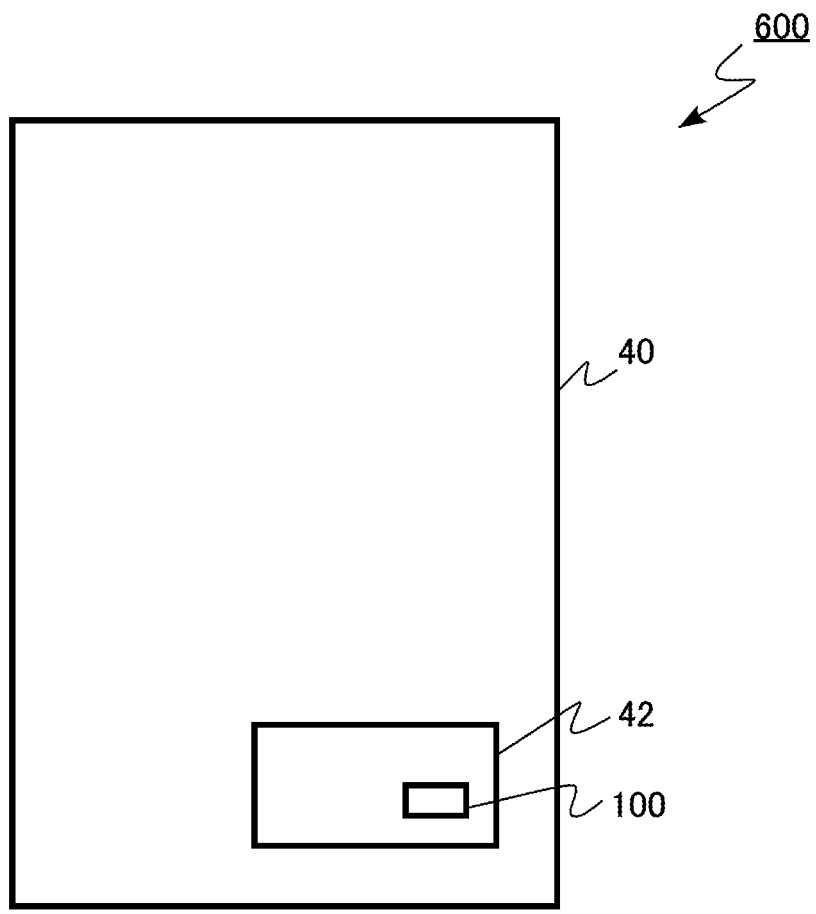
FIG. 23 is a diagram schematically illustrating a computer according to a ninth embodiment.

FIG. 23 is a diagram schematically illustrating the computer according to this embodiment. The computer according to this embodiment is a server 600.

The server 600 includes a power circuit 42 provided in a housing 40. The server 600 is a computer that executes server software.

The power circuit 42 includes the HEMT 100 according to the first embodiment. Instead of the HEMT 100, the HEMT 200, the HEMT 300, the HEMT 400, and the HEMT 500 according to the fifth to eighth embodiments may be applied. The power circuit 42 may be a power circuit for automobile use.

Since the power circuit 42 includes the HEMT 100 in which current collapse is prevented, it has high reliability. Since the server 600 includes the power circuit 42, it has high reliability.

According to this embodiment, it is possible to achieve a power circuit and a computer with high reliability.

In the above-described embodiments, GaN or AlGaN is given as an example of the material forming the GaN-based semiconductor layer. However, for example, InGaN, InAlN, and InAlGaN including indium (In) may be applied. In addition, AlN may be applied as the material forming the GaN-based semiconductor layer.

In the above-described embodiments, the invention is applied to the HEMT. However, the invention is not limited to the HEMT and may be applied to other devices such as transistors or diodes.

While certain embodiments have been described, these embodiments have been presented by way of example only, and are not intended to limit the scope of the inventions. Indeed, the semiconductor device, the power circuit, and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a nitride semiconductor layer comprising a first layer and a second layer;
an insulating layer provided on the nitride semiconductor layer;
a first electrode contacting the first layer;
a second electrode contacting the first layer; and
a gate electrode provided between the first electrode and the second electrode;
wherein:
the second layer is provided between the first layer and the insulating layer,
the second layer has a higher electric resistivity than the first layer,
the second layer comprises an atom Y, the atom Y being an atom of at least one element selected from the group consisting of beryllium (Be), magnesium (Mg), calcium (Ca), strontium (Sr), barium (Ba), zinc (Zn), and cadmium (Cd), and
the first electrode directly contacts the first layer, and the second electrode directly contacts the first layer.

2. The semiconductor device according to claim 1,
wherein a concentration of the atom Y in the second layer is equal to or greater than $1 \times 10^{19}$ cm$^{-3}$.

3. The semiconductor device according to claim 1,
wherein the second layer comprises a first atom, the first atom being at least one element selected from the group consisting of oxygen (O), sulfur (S), selenium (Se), and tellurium (Te).

4. The semiconductor device according to claim 1,
wherein the second layer comprises a second atom, the second atom being at least one element selected from the group consisting of silicon (Si), germanium (Ge), titanium (Ti), zirconium (Zr), hafnium (Hf), and iron (Fe).

5. The semiconductor device according to claim 1,
wherein, when an atom other than a nitrogen atom forming a crystal structure of the nitride semiconductor layer is an atom X, the atom Y is present at a lattice position of the atom X.

6. A power circuit comprising:
the semiconductor device according to claim 1.

7. A computer comprising:
the semiconductor device according to claim 1.

8. A semiconductor device comprising:
a nitride semiconductor layer comprising a first layer and a second layer;
an insulating layer provided on the nitride semiconductor layer;
a first electrode contacting the first layer;
a second electrode contacting the first layer; and
a gate electrode provided between the first electrode and the second electrode;
wherein:
the second layer is provided between the first layer and the insulating layer,
the second layer comprises at least one atom selected from a first atom Y, a second atom Y, and a third atom Y, the first atom Y having a dangling bond, the second atom Y forming a bond with a first atom of at least one element selected from the group consisting of oxygen (O), sulfur (S), selenium (Se), and tellurium (Te), the third atom Y forming a bond with a second atom of at least one element selected from the group consisting of silicon (Si), germanium (Ge), titanium (Ti), zirconium (Zr), hafnium (Hf), and iron (Fe), and atom Y being an atom of at least one element selected from the group consisting of beryllium (Be), magnesium (Mg), calcium (Ca), strontium (Sr), barium (Ba), zinc (Zn), and cadmium (Cd), and
the first electrode directly contacts the first layer, and the second electrode directly contacts the first layer.

9. The semiconductor device according to claim 8,
wherein, when an atom other than a nitrogen atom forming a crystal structure of the nitride semiconductor layer is an atom X, the first atom Y, the second atom Y, and the third atom Y is present at a lattice position of the atom X.

10. The semiconductor device according to claim 9,
wherein the atom X is a gallium (Ga) atom or an aluminum (Al) atom.

11. The semiconductor device according to claim 5,
wherein the atom X is a gallium (Ga) atom or an aluminum (Al) atom.

* * * * *